(12) United States Patent
Li et al.

(10) Patent No.: US 11,355,660 B2
(45) Date of Patent: Jun. 7, 2022

(54) PHOTOVOLTAIC MODULE

(71) Applicants: ZHEJIANG JINKO SOLAR CO., LTD., Haining (CN); JINKO SOLAR CO., LTD., Jiangxi (CN)

(72) Inventors: Bairu Li, Haining (CN); Menglei Xu, Haining (CN); Jie Yang, Haining (CN); Xinyu Zhang, Haining (CN); Hao Jin, Haining (CN)

(73) Assignees: ZHEJIANG JINKO SOLAR CO., LTD., Haining (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 17/108,994

(22) Filed: Dec. 1, 2020

(65) Prior Publication Data
US 2022/0140166 A1 May 5, 2022

(30) Foreign Application Priority Data

Nov. 2, 2020 (CN) .......................... 202011204048.6
Nov. 2, 2020 (CN) .......................... 202011204055.6

(51) Int. Cl.
*H01L 31/048* (2014.01)
*H02S 50/10* (2014.01)
(Continued)

(52) U.S. Cl.
CPC .... *H01L 31/0481* (2013.01); *B32B 17/10788* (2013.01); *H01L 31/0216* (2013.01); *H01L 31/05* (2013.01); *H02S 50/10* (2014.12)

(58) Field of Classification Search
CPC ............................ H01L 31/0481; H02S 50/10
See application file for complete search history.

(56) References Cited

U.S. PATENT DOCUMENTS 4,210,462 A * 7/1980 Tourneux ................ B29C 43/56
136/251
6,204,443 B1 * 3/2001 Kiso .................. B32B 17/10788
126/621
(Continued)

FOREIGN PATENT DOCUMENTS

CN 205282510 U 6/2016
CN 105916921 A 8/2016
(Continued)

OTHER PUBLICATIONS

Zhejiang Jinko Solar Co., Ltd., et al., Extended European Search Report, EP20209702.8, dated May 18, 2021, 8 pgs.
(Continued)

*Primary Examiner* — Sadie White
(74) *Attorney, Agent, or Firm* — USCH Law, PC

(57) ABSTRACT

The embodiments of the present disclosure provide a photovoltaic module including a base plate, a cell string and a cover plate stacked in order; a first packaging layer located between the base plate and the cover plate and surrounding the cell string, the first packaging layer, the base plate and the cover plate defining a sealed space; and a moisture treatment layer located in the sealed space. The moisture treatment layer includes at least one of a functional layer and a moisture detection layer. The functional layer is adaptive to absorb moisture and be converted into a solidified layer, the solidified layer has a degree of cross linking greater than a degree of cross linking of the functional layer. The moisture detection layer is adaptive to detect and determine whether there is moisture in the sealed space through response information of the moisture detection layer.

12 Claims, 14 Drawing Sheets

(51) Int. Cl.
  *B32B 17/10*    (2006.01)
  *H01L 31/05*    (2014.01)
  *H01L 31/0216*  (2014.01)

(56) References Cited

U.S. PATENT DOCUMENTS

| | | | |
|---|---|---|---|
| 2002/0172354 A1* | 11/2002 | Nishi | H01H 13/70 379/433.07 |
| 2004/0216778 A1 | 11/2004 | Ferri et al. | |
| 2007/0227584 A1* | 10/2007 | Tsunomura | H01L 31/048 136/251 |
| 2010/0297798 A1* | 11/2010 | Adriani | B32B 17/10788 438/64 |
| 2010/0304091 A1 | 12/2010 | Wang | |
| 2012/0017980 A1 | 1/2012 | Lai | |
| 2012/0048349 A1 | 3/2012 | Metin et al. | |
| 2012/0080065 A1 | 4/2012 | Krajewski et al. | |
| 2012/0167985 A1 | 7/2012 | Ichimura et al. | |
| 2013/0323874 A1 | 12/2013 | Furihata et al. | |
| 2018/0248061 A1* | 8/2018 | Bullen | H01L 31/0481 |
| 2019/0006547 A1* | 1/2019 | Watts | B32B 17/1055 |
| 2019/0096590 A1* | 3/2019 | Lee | H01G 9/2009 |
| 2021/0082634 A1* | 3/2021 | Lee | H01G 9/0029 |

FOREIGN PATENT DOCUMENTS

| | | |
|---|---|---|
| CN | 207009482 U | 2/2018 |
| CN | 207217595 U | 4/2018 |
| CN | 209260765 U | 8/2019 |
| CN | 110437733 A | 11/2019 |
| CN | 210429839 U | 4/2020 |
| EP | 3640997 A1 | 4/2020 |
| JP | 798309 A | 4/1995 |
| JP | 2003100449 A | 4/2003 |
| JP | 2008520777 A | 6/2008 |
| JP | 2013509453 A | 3/2013 |
| JP | 2013254768 A | 12/2013 |
| JP | 2016504758 A | 2/2016 |
| JP | 201921913 A | 2/2019 |
| JP | 2019519942 A | 7/2019 |
| WO | 2004019421 A1 | 3/2004 |
| WO | 2016047127 A1 | 3/2016 |
| WO | WO-2019160264 A1 * | 8/2019 ............ H01L 31/18 |
| WO | 2020059022 A1 | 3/2020 |
| WO | 2020208854 A1 | 10/2020 |

OTHER PUBLICATIONS

Zhejiang Jinko Solar Co., Ltd., et al., JP First Office Action, JP2020-193921, dated Feb. 25, 2021, 6 pgs.

Zhejiang Jinko Solar Co., Ltd. et al., JP First Office Action, JP 2020-193921, dated Feb. 25, 2021, with English Translation, 12 pgs.

Zhejiang Jinko Solar Co., Ltd. et al., JP Second Office Action, 2020-193921, dated Jun. 21, 2021, with English Translation, 8 pgs.

Zhejiang Jinko Solar Co., Ltd., et al., Examination report No. 1 for your standard patent application, AU 2020277176, dated Aug. 19, 2021, 8 pgs.

Cheacharoen R. et al., "Encapsulating perovskite solar cells to withstand damp heat and thermal cycling," Sustainable Energy & Fuels, The Royal Society of Chemistry, Issue 11, Jul. 3, 2018, 9 pgs.

\* cited by examiner

PHOTOVOLTAIC MODULE

CROSS REFERENCE TO RELATED APPLICATIONS

The present application claims priority to Chinese Patent Application No. 202011204048.6, filed Nov. 2, 2020, and Chinese Patent Application No. 202011204055.6, filed Nov. 2, 2020, each of which is incorporated herein by reference in its entirety.

TECHNICAL FIELD

The present disclosure relates to the field of solar energy technology, in particular, to a photovoltaic module.

BACKGROUND

A photovoltaic module is a device that directly converts light energy into electrical energy through a photoelectric effect or a photochemical effect. The photovoltaic module may be a silicon-based photovoltaic module, a gallium arsenide (GaAs) photovoltaic module or a perovskite photovoltaic module and the like. As a most promising photovoltaic cell in the third generation of solar cells, a perovskite photovoltaic module has been greatly improved in terms of energy conversion efficiency in the past ten years. Due to a low manufacturing cost of the perovskite photovoltaic module, the perovskite photovoltaic module is expected to play a huge role in the energy field.

A packaging technology can separate a cell string in a photovoltaic module from an external environment, preventing pollution and corrosion of various impurities, and is a method to improve a service life of a precision electronic element. However, because materials in a perovskite photovoltaic module are sensitive to water vapor, oxygen, pressure, etc. in the air, an existing packaging technology cannot meet what is needed, and the service life of the photovoltaic module still needs to be increased.

SUMMARY

Embodiments of the present disclosure provide a photovoltaic module, to improve packaging technology of the photovoltaic module, thereby prolonging service life of the photovoltaic module.

Some embodiments of the present disclosure provide a photovoltaic module including: a base plate, a cell string and a cover plate stacked in order; a first packaging layer located between the base plate and the cover plate and surrounding the cell string, the first packaging layer, the base plate and the cover plate defining a first sealed space; and a moisture treatment layer located in the first sealed space. The moisture treatment layer includes at least one of a functional layer and a moisture detection layer. The functional layer is adaptive to absorb moisture and be converted into a solidified layer, and the solidified layer has a degree of crosslinking greater than a degree of crosslinking of the functional layer. The moisture detection layer is adaptive to detect and determine whether there is moisture in the first sealed space through response information of the moisture detection layer.

In some embodiments, the moisture treatment layer is at least located between the first packaging layer and the cell string.

In some embodiments, the cell string has a first surface and a second surface opposite each other, and a side surface connecting the first surface and the second surface, the first surface being away from the base plate, and the second surface facing the base plate; and the first surface includes a central region and a peripheral region surrounding the central region, and the moisture treatment layer is located on the side surface and on the first surface of the peripheral region.

In some embodiments, the moisture treatment layer is attached to the side surface and the first surface of the peripheral region.

In some embodiments, the photovoltaic module further includes a separation layer located on the side surface and the first surface of the peripheral region, the separation layer located between the moisture treatment layer and the cell string.

In some embodiments, the moisture treatment layer is further located on the first surface of the central region.

In some embodiments, the moisture treatment layer is arranged around the cell string, and the moisture treatment layer, the base plate and the cover plate define a second sealed space.

In some embodiments, there are corner junction regions between the first packaging layer and the base plate and between the first packaging layer and the cover plate, and the moisture treatment layer is located at least in the corner junction regions.

In some embodiments, the moisture treatment layer is further located on an inner wall surface of the first packaging layer facing the cell string.

In some embodiments, the photovoltaic module further includes a second packaging layer filling the first sealed space.

In some embodiments, the base plate is a conductive substrate, and the cell string includes a plurality of perovskite solar cells.

In some embodiments, the base plate is a bearing board, and the cell string includes a plurality of perovskite solar cells.

In some embodiments, materials for the functional layer include a hydrolyzable and crosslinkable material.

In some embodiments, the functional layer includes a first functional layer and a second functional layer stacked in order, the first functional layer is located between the second functional layer and the cell string, a material for the first functional layer is a material that is already hydrolyzed and crosslinked based on a hydrolyzable and crosslinkable material, and materials for the second functional layer include a hydrolyzable and crosslinkable material.

In some embodiments, the hydrolyzable and crosslinkable material may be either silane modified polyurethane or silicone.

In some embodiments, materials for the first packaging layer include moisture-solidified materials, optical-solidified materials or additive-solidified materials.

In some embodiments, the moisture detection layer includes a moisture absorption color changeable layer, a moisture-sensitive resistor or a moisture-sensitive sensor.

Some embodiments of the present disclosure further provide a photovoltaic module including: a base plate, a cell string and a cover plate stacked in order; a first packaging layer located between the base plate and the cover plate and surrounding the cell string, the first packaging layer, the base plate and the cover plate defining a third sealed space; and a solidified layer located within the third sealed space, materials for the solidified layer including a material converted from a hydrolyzable and crosslinkable material after absorbing moisture.

In some embodiments, the solidified layer is at least located between the first packaging layer and the cell string.

Compared with existing technologies, the technical solutions provided in the present disclosure at least have the following advantages.

The photovoltaic module provided in some embodiments of the present disclosure includes a functional layer in a sealed space. The functional layer is adaptive to absorb moisture and be converted into a solidified layer with a degree of cross linking greater than a degree of cross linking of the functional layer. Therefore, the functional layer may absorb moisture and be converted into a solidified layer after absorbing the moisture, thereby automatically performing packaging on the photovoltaic module for a second time. In this way, the moisture is prevented from damaging a cell string, thereby tightness of the package is improved, the packaging technology for the photovoltaic module is improved, and the service life of the photovoltaic module is prolonged.

In some embodiments, the photovoltaic module includes a moisture detection layer located in a sealed space. It is detected and determined whether there is moisture in the sealed space through response information of the moisture detection layer. Therefore, when moisture enters the sealed space, an operator may perform re-packaging on the photovoltaic module in time according to a detection result on the moisture detection layer, thereby moisture is further prevented from damaging the cell string, and the service life of the photovoltaic module is further prolonged.

BRIEF DESCRIPTION OF THE DRAWINGS

One or more embodiments are described as examples with reference to the corresponding figures in the accompanying drawings, and the examples do not constitute a limitation to the embodiments. The figures in the accompanying drawings do not constitute a proportion limitation unless otherwise stated.

DETAILED DESCRIPTION

Figure 1:
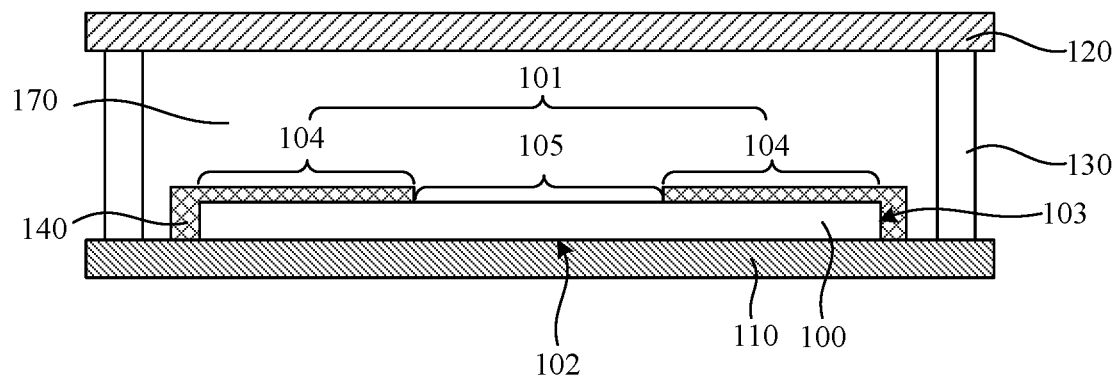
FIGS. 1-7 are schematic diagrams showing structures of a photovoltaic module provided in a first embodiment of the present disclosure.

It is known from the above background that a packaging technology and a service life of a photovoltaic module need to be improved.

It is found through analysis that reasons for the above is that during packaging of a photovoltaic module, it is common that a package is not packaged tight enough; during use of the photovoltaic module, it is common for a packaging material to age due to light, heat and water. Therefore, under moisture, it is easy for a cell string to be decomposed or less efficient and cease to work.

In order to address the problems, an embodiment of the present disclosure provides a photovoltaic module and a manufacturing method for the photovoltaic module. The photovoltaic module has a functional layer for absorbing moisture and being converted into a solidified layer, the solidified layer having a degree of cross linking greater than that of the functional layer. Therefore, in a case where packaging is not tight enough or the packaging material ages, the functional layer may absorb moisture and becomes a solidified layer to be packaged a second time, thereby moisture may be blocked out and the packaging is enhanced.

An embodiment of the present disclosure provides a photovoltaic module and a manufacturing method for the photovoltaic module. The photovoltaic module has a moisture detection layer. It is detected and determined whether there is moisture in a sealed space through response information of the moisture detection layer. Therefore, in a case where packaging is not tight or a packaging material ages, the moisture detection layer may quickly detect moisture in the sealed space. Based on response information of the moisture detection layer, an operator may re-package the photovoltaic module, thereby service life of the photovoltaic module is prolonged.

An embodiment of the present disclosure further provides a photovoltaic module having a functional layer and a moisture detection layer. The functional layer is adaptive to absorb moisture and be converted into a solidified layer having a degree of cross linking greater than a degree of cross linking of the functional layer. The moisture treatment layer is adaptive to detect and determine whether there is moisture in a sealed space through response information of the moisture detection layer. Therefore, in a case where packaging is not tight or a packaging material ages, the functional layer may absorb moisture in the sealed space and be converted into a solidified layer to block moisture from entering the cell string, thereby a second packaging is realized. In addition, the moisture detection layer may detect and locate a particular position of the moisture so that an operator may re-package the photovoltaic module, thereby service life of the photovoltaic module is prolonged.

In order to make the objective, the technical solution and advantages of the present disclosure clearer, a detailed description is provided on embodiments of the present disclosure with reference to the drawings. However, those skilled in the art may appreciate that in the embodiments of the present disclosure, a plurality of technical details are provided for readers to better understand the present disclosure. However, even if the technical details and variants and amendments based on the following embodiments are not provided, the technical solution that the present disclosure claims to protect can still be implemented. FIGS. 1-7 are schematic diagrams showing structures of a photovoltaic module provided in a first embodiment of the present disclosure.

With reference to FIGS. 1-7, the first embodiment of the present disclosure provides a photovoltaic module including: a base plate 110, a cell string 100 and a cover plate 120 staked in order; a first packaging layer 130 located between the base plate 110 and the cover plate 120 and surrounding the cell string 100, the first packaging layer 130, the base plate 110 and the cover plate 120 defining a first sealed space; a functional layer 140 located within the first sealed space, adaptive to absorb moisture and be converted into a solidified layer, and the solidified layer having a degree of cross linking greater than that of the functional layer.

A further description is provided in details in the following with reference to the drawings.

With reference to FIGS. 1-7, the base plate 110 may be a conductive substrate, and the cell string 100 may include a plurality of perovskite solar cells. That is, in this embodiment, the base plate 110 can not only bear the cell string 100, but also can serve as an anode to collect electrons generated by the cell string 100 after light exposure. The base plate 110 may be fluorine-doped tin oxide conductive glass or indium tin oxide conductive glass. It may be appreciated that the conductive base plate may be conductive glass of the perovskite solar cell.

In this embodiment, the cell string 100 is a perovskite solar cell film layer including such structures as a hole transport layer, a perovskite layer, an electron transport layer and a metal electrode. When exposed to sunlight, the perovskite layer first absorbs photons to generate electron-hole pairs. Un-recombined electrons and holes are separately collected by the electron transport layer and the hole transport layer. That is, the electrons are transmitted from the perovskite layer to the electron transport layer and finally collected by the base plate 110; the holes are transmitted from the perovskite layer to the hole transport layer and finally collected by the metal electrode. At last, photocurrent is generated through a circuit connecting the base plate 110 and the metal electrode. Because a perovskite material has a low carrier recombination probability and a high carrier transferring rate, a diffusion distance and a life of a carrier are relatively long. Therefore, the perovskite solar cell has a high photoelectric conversion efficiency.

In another embodiment, the cell string may further include such cell film layers as gallium arsenide, copper indium selenium or cadmium telluride layers.

It may be appreciated that the cell string 100 is of a cell structure formed by a plurality of solar cells connected in parallel or in series. For example, the cell string may include a plurality of sub-strings connected in parallel or in series, and each of the plurality of sub-strings may further include a plurality of solar cells connected in series.

In this embodiment, the cover plate 120 may be glass. In another embodiment, the cover plate may be transparent plastic.

The first packaging layer 130 may be located between the base plate 110 and the cover plate 120, surrounding the cell string 100. The first packaging layer 130, the base plate 110 and the cover plate 120 define the first sealed space.

A material for the first packaging layer 130 may be a moisture-solidified material, a light-solidified material or an additive-curing material, for example, polyisobutylene, polyolefin or polyurethane. Because the perovskite solar cell is not resistant to a high temperature, temperature should not be too high during a lamination process of the photovoltaic module. If the first packaging layer 130 is a thermos-solidified material, it is difficult for the temperature during the lamination process to reach a temperature at which the first packaging layer 130 is solidified, thus the first packaging layer 130 may not be solidified completely, resulting in inadequate packaging. Therefore, the moisture-solidified material, the light-solidified material or the additive-curing material are used for the first packaging layer 130 to avoid the above problem. In this way, the first packaging layer 130 may be solidified well without a high temperature.

A width of the first packaging layer 130 in a direction parallel to a surface of the base plate 110 is 3 mm-500 mm. It shall be noted that if a width of the first packaging layer 130 is too small, it would be easy for a problem of inadequate packaging to occur; but if the width is too large, an area of the photovoltaic module would be increased. Therefore, the above two problems may be avoided if the width of the first packaging layer 130 is 3 mm-500 mm.

With reference to FIGS. 1 to 6, in this embodiment, the first sealed space may be further filled with a second packaging layer 170.

The second packaging layer 170 may further enhance sealing to avoid moisture intrusion.

A material for the second packaging layer 170 differs from that of the first packaging layer 130, and may be an ethylene vinyl acetate (EVA) film layer.

In another embodiment, the material for the second packaging layer 170 may be identical with that of the first packaging layer 130. Alternatively, there may not be a second packaging layer in the first sealed space, i.e., there is a gap in the first sealed space.

The functional layer 140 is located within the first sealed space. If either the first packaging layer 130 or the second packaging layer 170 is not packaged adequately or has aged material, the functional layer 140 may absorb moisture and be converted into a solidified layer. The solidified layer has a degree of cross linking greater than that of the functional layer 140. That is, the functional layer 140 may perform packaging on the cell string 100 for a second time, thereby preventing the cell string 100 from being decomposed or ceasing to be effective in moisture.

It may be appreciated that in this embodiment, what the functional layer 140 absorbs may be moisture entered the first sealed space, and the functional layer 140 prevents the moisture in the first sealed space from damaging the cell string 100.

The degree of cross linking is further called cross linking index or cross linking density, and may be used to represent a degree of cross linking of a molecular chain. In particular, the degree of cross linking refers to a fraction taken by a cross-linked structural unit of an entire structural unit. The degree of cross linking is proportional with the amount of cross link bonds: the greater the degree of cross linking, the more cross link bonds in a unit volume and the greater the cross linking density. A thickness of the functional layer 140 is greater than or equal to 500 nm. If the thickness of the functional layer 140 is excessively thin, a compactness of the functional layer 140 is poor after absorbing moisture. Therefore, the thickness of the functional layer 140 is at least 500 nm, thereby improving the second packaging effect.

In this embodiment, a material for the functional layer 140 may be a hydrolyzable and crosslinkable material that can absorb moisture entering into the first sealed space and that may have a cross-linking reaction after absorbing moisture. In this way, viscosity and compactness of the material are increased, and the second packaging may be performed.

The hydrolyzable and crosslinkable material may be silane modified polyurethane or silicone. In addition, the hydrolyzable and crosslinkable material may be either a single-component hydrolyzable and crosslinkable material or a double-component hydrolyzable and crosslinkable material.

In another embodiment, apart from the hydrolyzable and crosslinkable material, materials for the functional layer may further include a material that is already hydrolyzed and cross-linked.

For silane-modified polyurethane, a prepolymer thereof has an aminosilane end cap, and the prepolymer reacting with external moisture may produce a cross-linked network structure. In addition, an organic functional silane has multiple functions. Firstly, the silane acts as an adhesion promoter to improve bonding; secondly, in a crosslinking process, the silane can accelerate a reaction.

For silicone, a main polymer chain thereof is composed of silicon-oxygen-silicon bonds, and does not contain a structure that may be polymerized by heating. That is, even at a high temperature, silicone is not prone to polymerize. Therefore, in subsequent use or packaging, silicone is not easily affected by temperature and can maintain good moisture absorption and crosslinking properties.

It may be appreciated that different hydrolyzable and crosslinkable materials for the functional layer 140 may enable the functional layer 140 to have different reactions internally when the functional layer is converting to a solidified layer. For example, the functional layer 140 may have a hydrolysis reaction, a polycondensation reaction, a cross-linking reaction, or an oligomerization reaction and the like. For example, when the material for the functional layer 140 is silane-modified polyurethane, the functional layer 140 undergoes a cross-linking reaction, and the number of Si—O—Si bonds in the solidified layer is greater than the number of Si—O—Si bonds in the functional layer 140. In another example, the compactness of the solidified layer may further be greater than the compactness of the functional layer.

In addition, it shall further be noted that the functional layer 140 absorbs moisture in the first sealed space and is converted into a solidified layer, including: a partial region of the functional layer 140 absorbs moisture to be converted into a solidified layer. Alternatively, all of the functional layer 140 absorbs moisture to be converted into a solidified layer. In this embodiment, the functional layer 140 includes a first functional layer and a second functional layer stacked in order, the first functional layer is located between the second functional layer and the cell string 100, the material for the first functional layer is a material that is already hydrolyzed and crosslinked based on a hydrolyzable and crosslinkable material, and materials for the second functional layer includes the hydrolyzable and crosslinkable material.

Since a non-hydrolysed and non-cross-linked material has flowability, while a hydrolysed and cross-linked material is highly adhesive, thus stacking the non-hydrolysed and non-cross-linked material and the hydrolysed and cross-linked material may reduce the flowability of the non-hydrolysed and non-cross-linked material, thereby thickness of the functional layer is more even.

In another embodiment, the functional layer may be a single-layered hydrolyzable and crosslinkable material, i.e., a material that is not hydrolyzed yet.

The functional layer 140 is at least located between the first packaging layer 130 and the cell string 100. In case of inadequate packaging or aged packaging of the first packaging layer 130 or the second packaging layer 170, a space between the first packaging layer 130 and the cell string 100 is a place where moisture enters earliest. Therefore, the functional layer 140 is provided between the first packaging layer 130 and the cell string 100, thereby enhancing the second packaging effect.

For technical solutions about a particular position of the functional layer 140 in the first sealed space, the following examples are mainly included:

Example One: with reference to FIG. 1, the cell string 100 has a first surface 101 and a second surface 102 opposite each other, and a side surface 103 connecting the first surface 101 and the second surface 102. The first surface 101 is away from the base plate 110, and the second surface 102 faces the base plate 110. The first surface 101 includes a central region 105 and a peripheral region 104 surrounding the central region 105. The functional layer 140 is located on the side surface 103 and on the first surface 101 of the peripheral region 104. The functional layer 140 is attached to the side surface 103 and the first surface 101 of the peripheral region 104.

Figure 2:
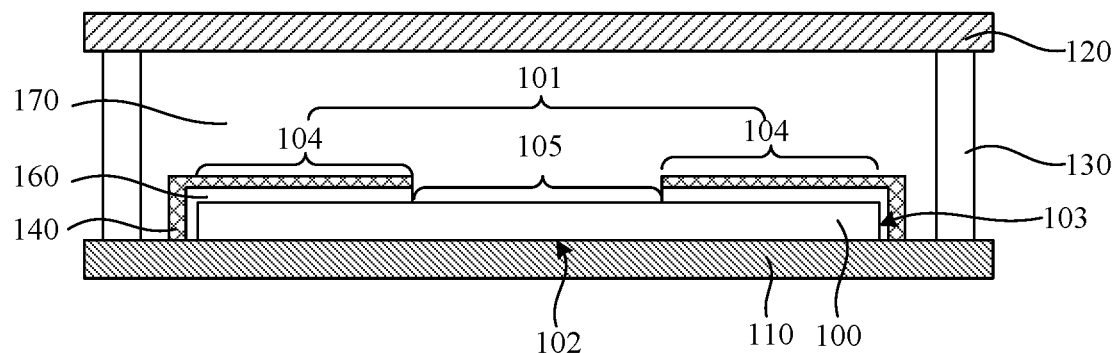

Example Two: with reference to FIG. 2, the photovoltaic module further includes a separation layer 160 located on the side surface 103 and the first surface 101 of the peripheral region 104, and the separation layer 160 is located between the functional layer 140 and the cell string 100.

The separation layer 160 can further improve tightness of the package, and the separation layer 160 can also separate the functional layer 140 from the cell string 100. If the material used for the functional layer 140 may react with the material for the cell string 100, the separation layer 160 can prevent the functional layer 140 from having an adverse effect on the cell string 100 and improve life of the cell string 100. A material for the separation layer 160 may be an EVA film.

Figure 3:
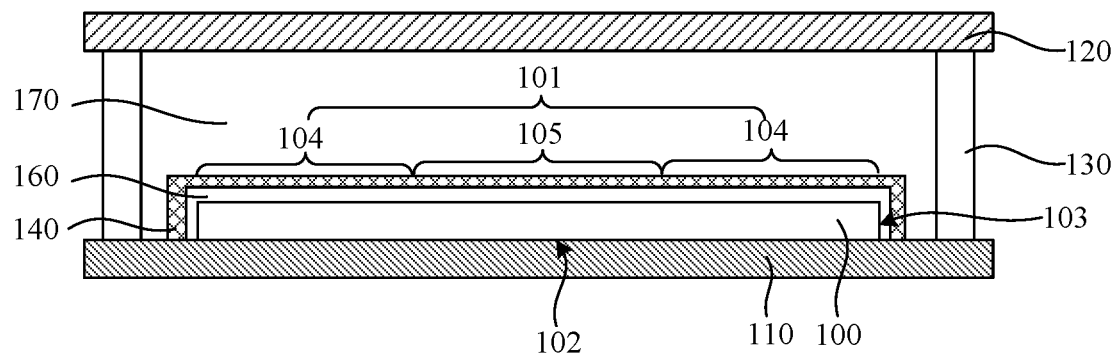

Example Three: with reference to FIG. 3, the functional layer 140 is further located on the first surface 101 of the central region 105. That is, the functional layer 140 is located on the side surface 103 and the first surface 101 of the cell string 100. A separation layer 160 is further included between the functional layer 140 and the cell string 100. It may be appreciated that the functional layer 140 can further be directly attached to the side surface 103 and the first surface 101 of the cell string 100, that is, there is no separation layer 160 between the functional layer 140 and the cell string 100.

Figure 4:
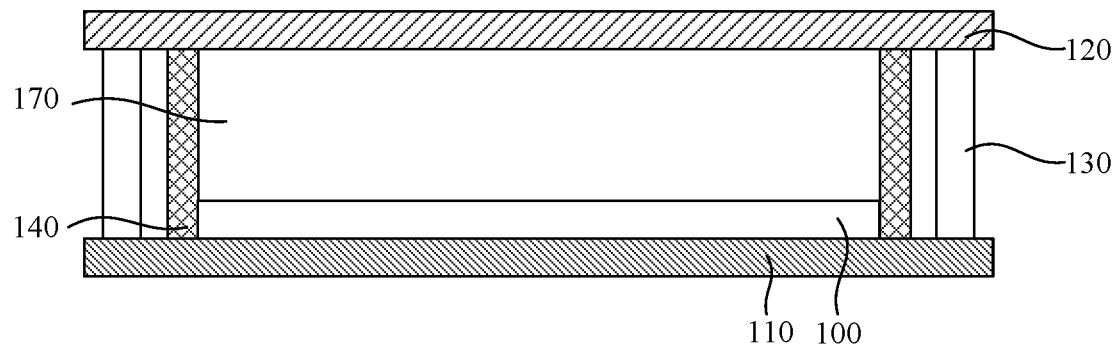

Example Four: with reference to FIG. 4, the functional layer 140 is arranged around the cell string 100, and the functional layer 140, the base plate 110 and the cover 120 define a second sealed space. That is, the functional layer 140 is arranged around the side surface 103 of the cell string 100 and encloses the cell string 100 in the second sealed space.

The functional layer 140 may be arranged close to a side surface of the cell string 100, or there may be a gap between the functional layer 140 and the side surface of the cell string 100; or there may be a separation layer between the functional layer 140 and the side surface 103 of the cell string 100.

Figure 5:
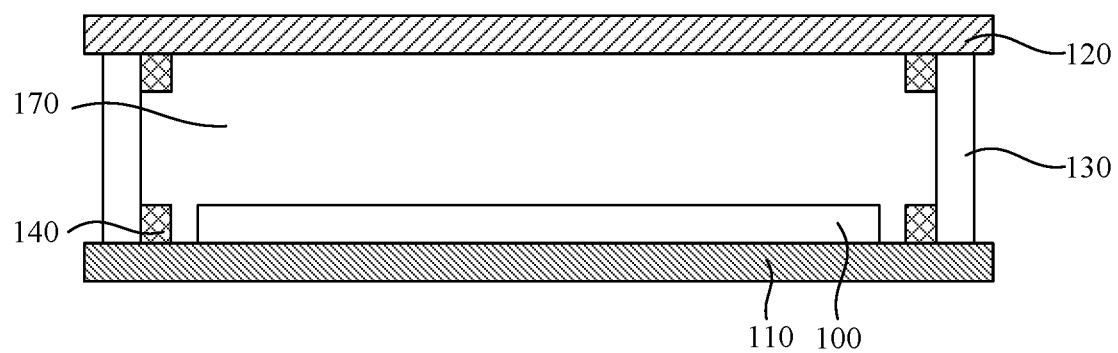

Example Five: with reference to FIG. 5, there are corner junction regions between the first packaging layer 130 and the base plate 110, and between the first packaging layer 130 and the cover plate 120, and the functional layer 140 is located at least in the corner junction regions. That is, the functional layer 140 covers a boundary between the first packaging layer 130 and the cover plate 120 and the base plate 110.

Figure 6:
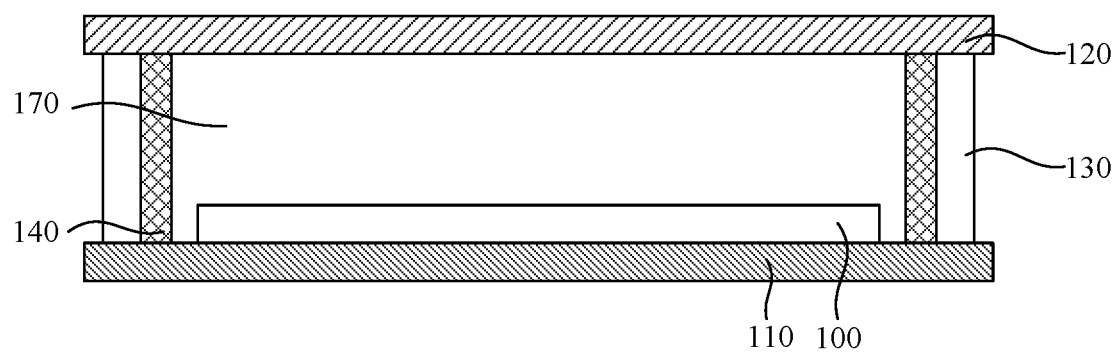

Example Six: with reference to FIG. 6, the functional layer 140 is further located on an inner wall surface of the first packaging layer 130 facing the cell string 100.

Figure 7:
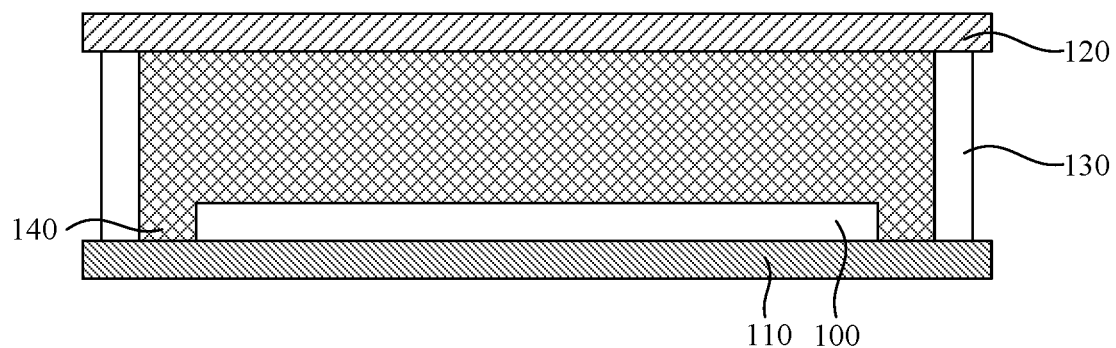

Example Seven: with reference to FIG. 7, the functional layer 140 fills the first sealed space. At this time, the functional layer 140 completely covers the cell string 100, and the functional layer 140 has a great thickness and can perform sealing well.

As shown in FIG. 7, the functional layer 140 is converted into a solidified layer after absorbing moisture, and the solidified layer is glued to the base plate 110, the first packaging layer 130 and the cover plate 120, thereby further improving sealing performance of the packaging structure.

To sum up, there is the functional layer 140 in the first sealed space of the photovoltaic module in this embodiment. The functional layer 140 can absorb moisture in the first sealed space, and can further be converted into a solidified layer after absorbing moisture to block intrusion of moisture, thereby prolonging service life of the cell string 100.

A second embodiment of the present disclosure provides a photovoltaic module substantially identical with the photovoltaic module provided in the first embodiment, but differs in that in this embodiment, a base plate may be a bearing board and a cell string includes a plurality of perovskite solar cells. In this embodiment, the first embodiment may be referred to for portions identical or similar to the photovoltaic module provided in the first embodiment, and content of the portions is not repeated. FIGS. 8-14 are schematic diagrams showing structures of a photovoltaic module provided in this embodiment.

Detailed description is provided in the following with reference to the drawings.

With reference to FIGS. 8-14, in this embodiment, the photovoltaic module includes: a base plate 210, a cell string 200 and a cover plate 220 stacked in order; a first packaging layer 230 located between the base plate 210 and the cover plate 220 and surrounding the cell string 200, the first packaging layer 230, the base plate 210 and the cover plate 220 defining a first sealed space; a functional layer 240 located within the first sealed space. The functional layer 240 is adaptive to absorb moisture and be converted into a solidified layer, and the solidified layer having a degree of cross linking greater than that of the functional layer 240.

In this embodiment, the base plate 210 may be a bearing board and the cell string 200 includes a plurality of perovskite solar cells. That is, the base plate 210 is adaptive to bear the cell string but does not have a function of collecting electrons. The base plate 210 may be glass or transparent plastic.

The cell string 200 includes a conductive glass 202 and a perovskite solar cell film layer 201. As an anode of a perovskite solar cell, the conductive glass 202 is used for collecting electrons.

With reference to FIGS. 8-13, there is a second packaging layer 270 between the cell string 200 and the base plate 210. The second packaging layer 270 may improve tightness of packaging.

It may be appreciated that the cell string 200 may be directly placed on the base plate 210; or there may be a functional layer and/or a second packaging layer between the cell string 200 and the base plate 210.

Figure 8:
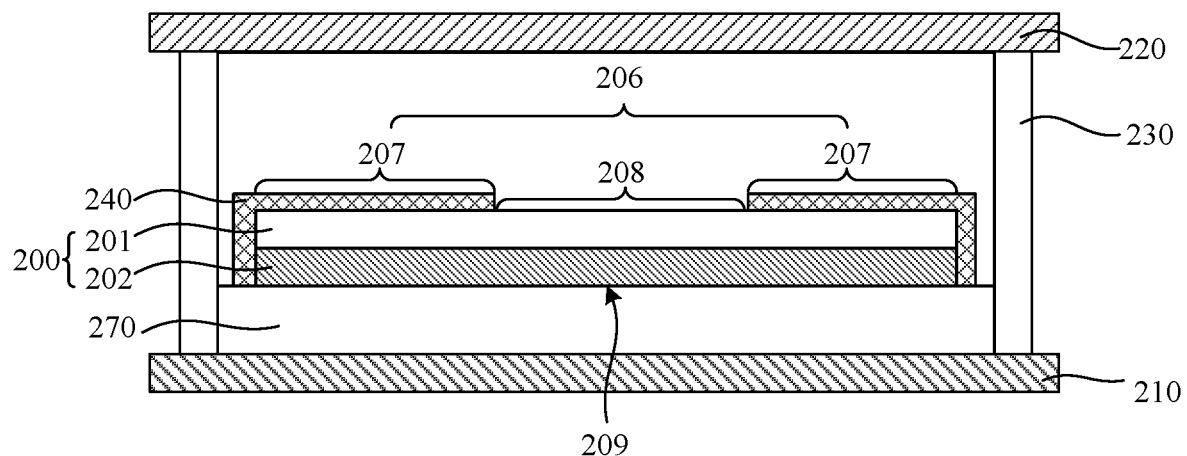
FIGS. 8-14 are schematic diagrams showing structures of a photovoltaic module provided in a second embodiment of the present disclosure.

For technical solutions about a particular position of the functional layer 240 in the first sealed space, the following examples are mainly included:

Example One: with reference to FIG. 8, the perovskite film layer 201 has a first surface 206 away from the base plate, the first surface 206 including a central region 208 and a peripheral region 207. The functional layer 240 is attached to a side surface of the perovskite film layer 201, the first surface 206 of the peripheral area 207 and a side surface of the conductive glass 202. The perovskite film layer 201 is arranged as being closely attached to the conductive glass 202, thus the functional layer 240 is further formed on the side surface of the conductive glass 202, thereby improving the tightness of the package.

Figure 9:
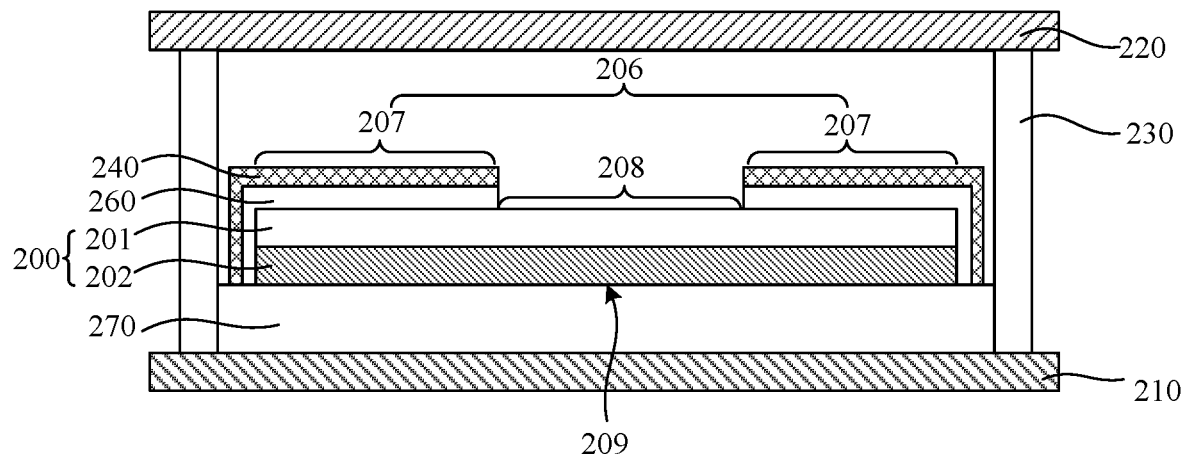

Example Two: with reference to FIG. 9, the photovoltaic module further includes a separation layer 260 located on the side surface of the perovskite film layer 201, the first surface 206 of the peripheral area 207 and the side surface of the conductive glass 202. The separation layer 260 is located between the functional layer 240 and the cell string 200.

Figure 10:
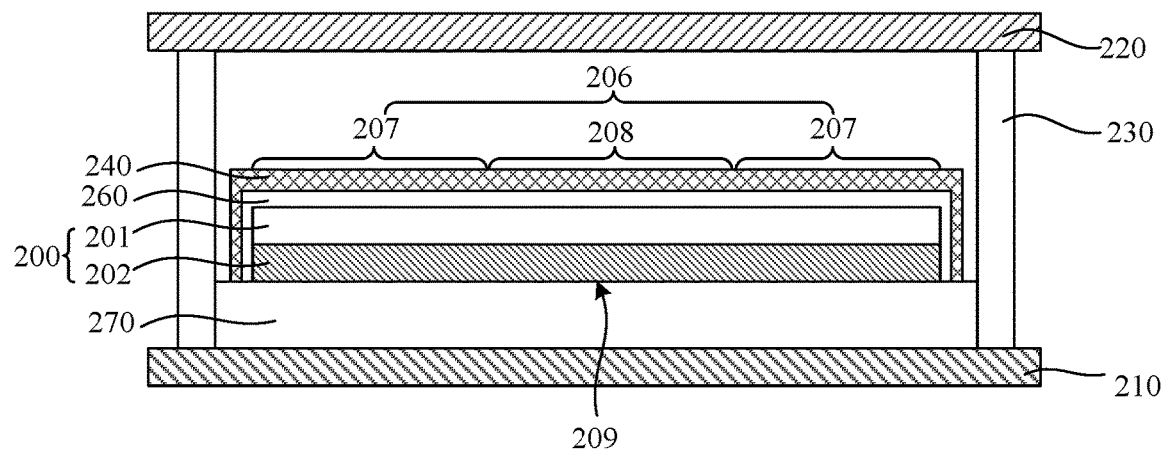

Example Three: with reference to FIG. 10, the functional layer 240 is further located on the first surface 206 of the central region 208 of the perovskite film layer 201.

Figure 11:
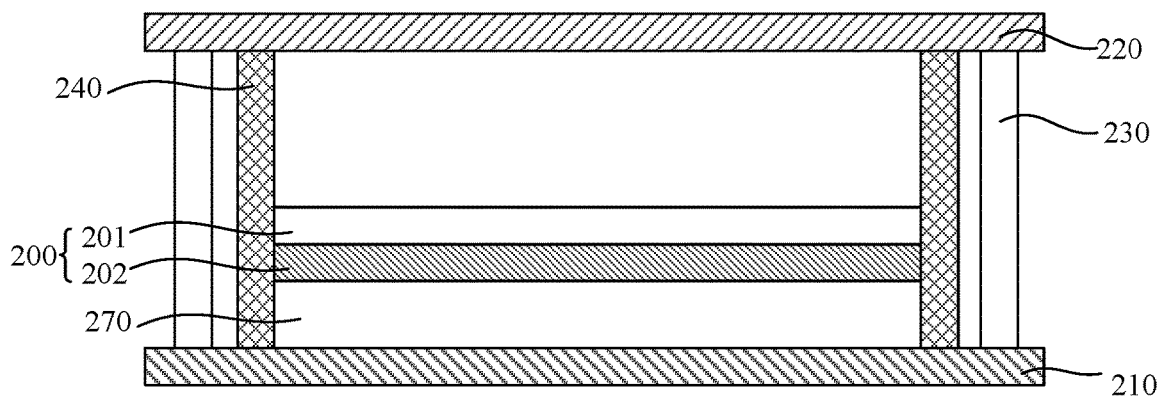

Example Four: with reference to FIG. 11, the functional layer 240 is arranged as surrounding the second packaging layer 270, the perovskite film layer 201 and the conductive glass 202. The functional layer 240, the base plate 210 and the cover plate 220 form a second sealed space.

Figure 12:
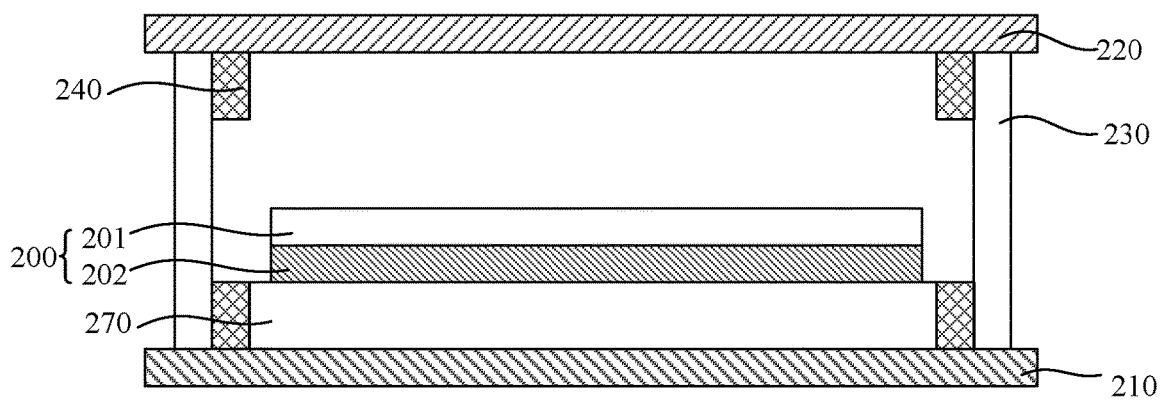

Example Five: with reference to FIG. 12, the functional layer 240 is located at corner junction regions between the first packaging layer 230 and the cover plate 220, and between the first packaging layer 230 and the base plate 210.

Figure 13:
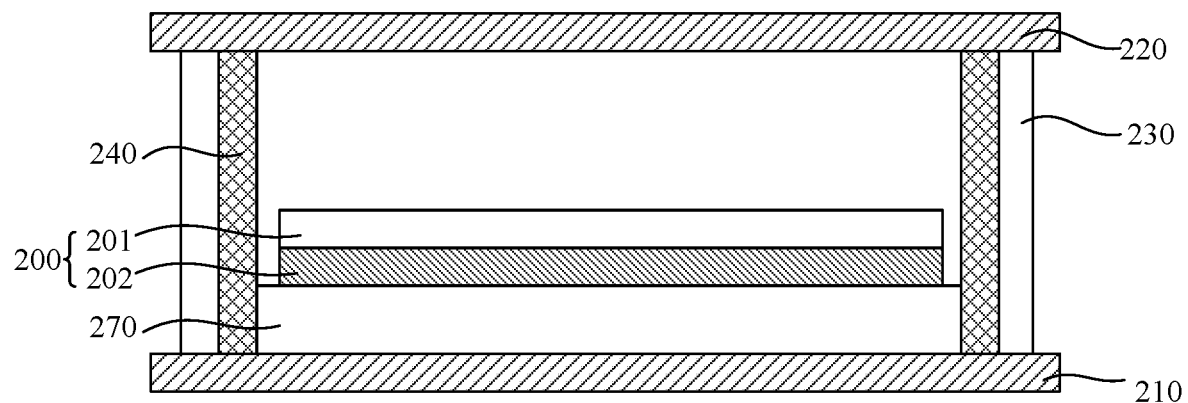

Example Six: with reference to FIG. 13, the functional layer 240 is further located on an inner wall surface of the first packaging layer 230 facing the cell string 200.

Figure 14:
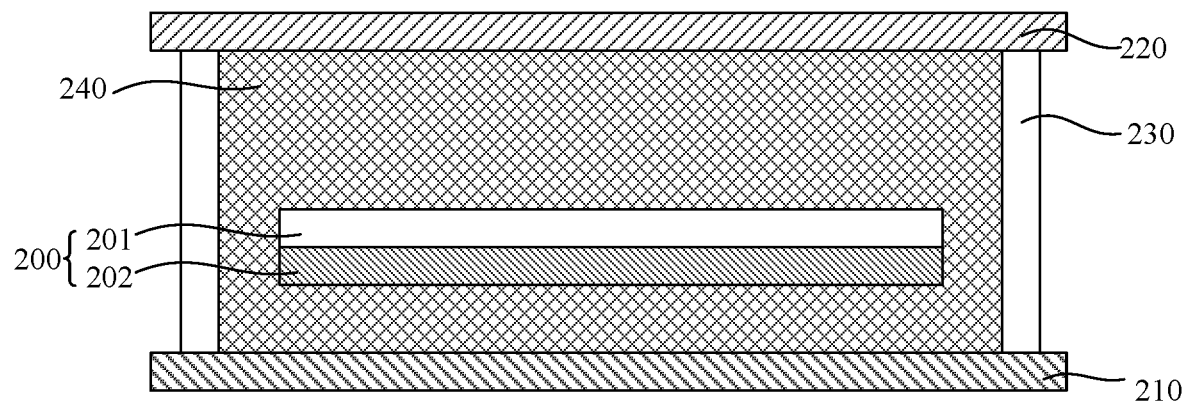

Example Seven: with reference to FIG. 14, the functional layer 240 fills the first sealed space. At this time, the functional layer 240 completely covers the cell string 200.

To sum up, the base plate 210 of the photovoltaic module provided in this embodiment is a bearing board. A second packaging layer 270 or a functional layer 240 may be provided between the bearing board and the cell string 200 to improve the tightness of the package. In addition, the functional layer 240 in the first sealed space can absorb moisture in the first sealed space, and can further be converted into a solidified layer after moisture absorption, preventing intrusion of moisture, thereby prolonging service life of the cell string 200.

Figure 15:
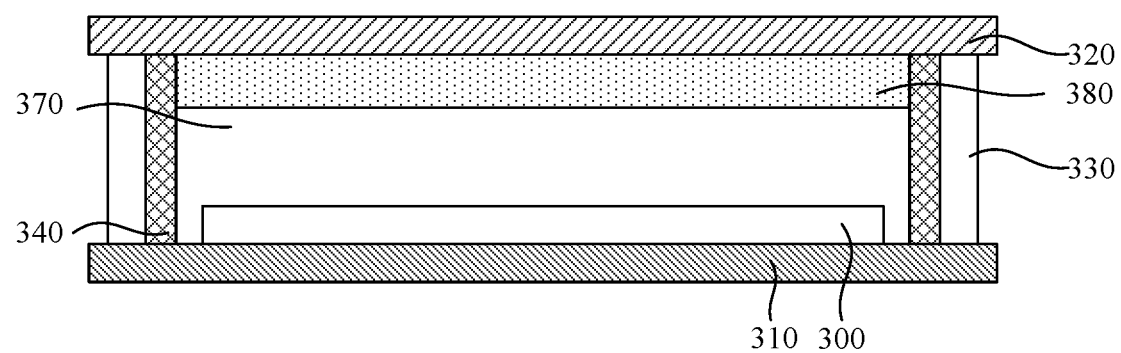
FIGS. 15-16 are schematic diagrams showing structures of a photovoltaic module provided in a third embodiment of the present disclosure.
Figure 16:
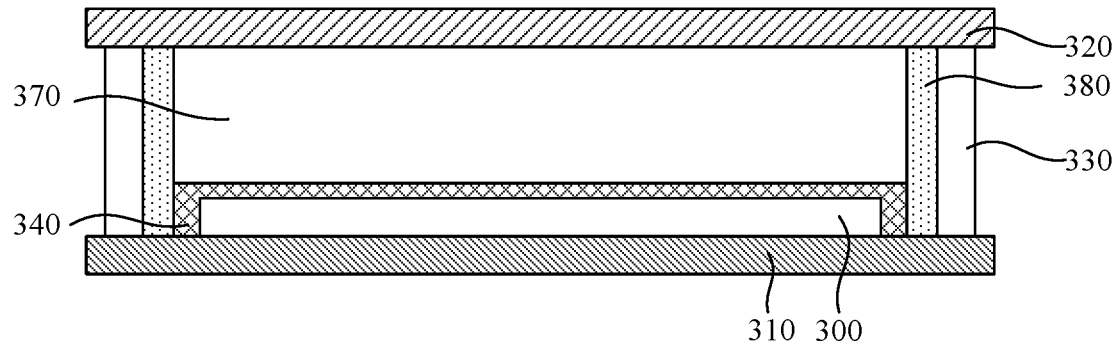

A third embodiment of the present disclosure provides a photovoltaic module substantially identical with the photovoltaic module provided in the first embodiment and the second embodiment. The photovoltaic module includes: a base plate, a cover plate, a cell string, a first packaging layer, a second packaging layer and a functional layer. A main difference between this embodiment and previous embodiments lies in that the photovoltaic module provided in this embodiment includes a moisture detection layer. For identical or similar portions of the photovoltaic module between this embodiment and the first and second embodiments, the first and second embodiments may be referred to and the content is not repeated here. FIGS. 15-16 are schematic diagrams showing structures of a photovoltaic module provided this embodiment.

With reference to FIGS. 15-16, a base plate 310 of a conductive base plate is taken as an example. It may be appreciated that the base plate 310 may alternatively be a bearing board. There is no limitation to a base plate in this embodiment.

A moisture detection layer 380 is located within a sealed space. It is detected and determined whether there is moisture in the sealed space through response information of the moisture detection layer 380. Therefore, when moisture enters the sealed space, the moisture detection layer 380 can detect the moisture quickly so that an operator may perform re-packaging on the photovoltaic module according to the response information.

The response information may be color information or photoelectrical information. The color information is taken as an example. The response information includes a first response information and a second response information. The first response information is that color remains unchanged, i.e., no moisture enters the sealed space. The second response information is that the color changes, i.e., moisture enters the sealed space. Therefore, if the response information of the moisture detection layer 380 is the second response information, the operator performs re-packaging on the photovoltaic module.

The moisture detection layer 380 includes a moisture absorption color changeable layer, a moisture-sensitive resistor or a moisture-sensitive sensor.

The moisture absorption color changeable layer changes its color after absorbing moisture. According to the change state of color, it may be determined whether there is moisture in the sealed space. In addition, a particular position of the moisture may be determined according to a particular position of color change of the moisture absorption color changeable layer. Therefore, the operator may locate the position of the moisture and perform re-packaging on the photovoltaic module in regard to the position where the moisture enters.

Materials for the moisture absorption color changeable layer may be: copper sulfate, cobalt chloride, methylene amines or organic phenols.

Resistance of the moisture-sensitive resistor may change after absorbing moisture, and based on the change, it may be determined whether there is moisture in the sealed space. In addition, a plurality of moisture-sensitive resistors may be arranged in the sealed space as separated from each other. A particular position of the moisture may be determined in regard to resistance changes of the moisture-sensitive resistors in different positions.

The moisture-sensitive sensor may detect humidity change and convert the humidity to a signal to be sent out. Based on the signal, it may be determined whether there is moisture in the sealed space. In addition, a plurality of moisture-sensitive sensors may be arranged in the sealed space as separated from each other. A particular position of the moisture may be determined in regard to signals of the moisture-sensitive sensors in different positions.

For positions of the moisture detection layer 380 in the sealed space, the following examples are mainly included:

Example One: with reference to FIG. 15, a moisture detection layer 380 is located within a space defined by a first packaging layer 330 and a functional layer 340, and a covering cover plate 320 faces an inner wall of the sealed space. In addition, a cell string 300 is further covered with a second packaging layer 370, and the moisture detection layer 380 is further located on the second packaging layer 370.

Example Two: with reference to FIG. 16, a moisture detection layer 380 is located on an inner wall of a first packaging layer 330, and covers a corner junction region between the first packaging layer 330 and a cover plate 320 and a base plate 310. In addition, a cell string 300 is further covered with a second packaging layer 370, and the moisture detection layer 380 is further located on a side wall of the second packaging layer 370.

It shall be noted that the moisture detection layer 380 may further be located at another position in the sealed space. A position of the moisture detection layer 380 is not limited in this embodiment.

To sum up, the photovoltaic module provided in this embodiment has a moisture detection layer capable of detecting and locating moisture in a sealed space. Therefore, an operator may perform re-packaging on the photovoltaic module according to response information of the moisture detection layer, so as to prevent a cell string from being damaged by moisture.

Figure 17:
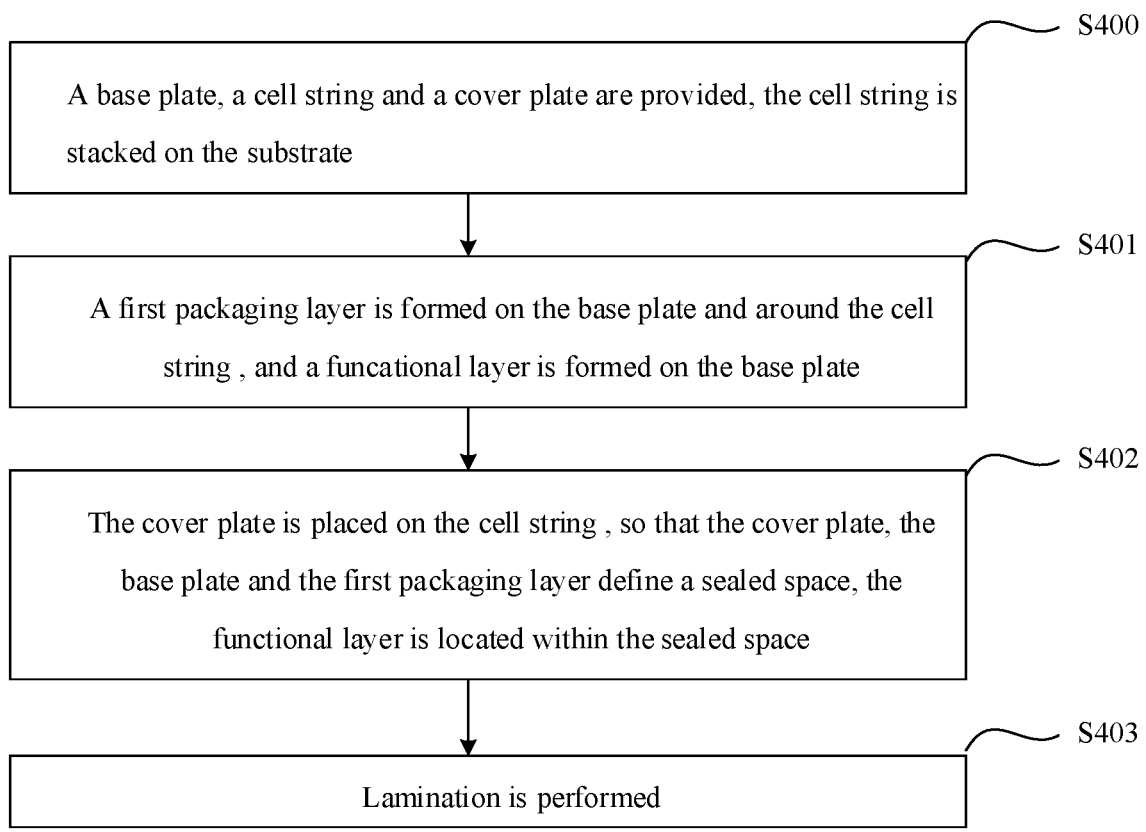
FIG. 17 is a flowchart showing a manufacturing method of a photovoltaic module provided in a fourth embodiment of the present disclosure.

A fourth embodiment of the present disclosure provides a manufacturing method for a photovoltaic module. FIG. 17 is a flowchart showing a manufacturing method of a photovoltaic module provided in this embodiment of the present disclosure.

With reference to FIG. 17 and FIGS. 1-7, at step S400, a base plate 110, a cell string 100 and a cover plate 120 are provided. The cell string 100 is stacked on the base plate 110.

In this embodiment, the base plate 110 may be a conductive substrate, the cell string 100 is a perovskite solar cell film layer. The cell string 100 is attached to the surface of the base plate 110, the cell string 100 includes a plurality of perovskite solar cells, and the conductive substrate may be conductive glass of the plurality of perovskite solar cells.

In another embodiment, a base plate may be a bearing board, a cell string may include a plurality of perovskite solar cells, and the cell string includes a conductive substrate and a perovskite solar cell film layer. The cell string may be attached to the base plate, or a functional layer and/or second packaging layer may be arranged between the cell string and the base plate.

It shall be noted that manufacturing of a photovoltaic module shall be performed in inert gas to prevent moisture in the outside from damaging the cell string 100.

At step S401, a first packaging layer 130 is formed on the base plate 110 and around the cell string 100, and a functional layer 140 is formed on the base plate 110.

Before forming the functional layer 140, the manufacturing method further includes: preprocessing the material for the functional layer 140 to improve adhesion of the material for the functional layer 140. A reason mainly lies in that the material for the functional layer 140 has a certain flowability before absorbing moisture, and the preprocessing on the material for the functional layer 140 may reduce the flowability of the functional layer 140, thereby improving evenness of thickness of the functional layer 140 and ensuring a result of a second packaging.

In particular, the material for the functional layer 140 may be mixed with additives such as catalyst, filler and plasticizer into paste or half-solidified liquid in inert gas or vacuum.

A height of the first packaging layer 130 is higher than a height of the cell string 100 in order to guarantee that the cell string 100 is in a space completely sealed after the cover plate 120 is placed.

It may be appreciated that an order of forming the first packaging layer 130 and the functional layer 140 is not fixed, but need to be adjusted according to a particular position arranged for the functional layer 140.

For a technical solution for forming the first packaging layer 130 and the functional layer 140, there may mainly be the following examples:

Example One: with reference to FIGS. 1-4 and 7, the functional layer 140 is formed earlier than the first packaging layer 130.

The cell string 100 has a first surface 101 and a second surface 102 opposite to each other and a side surface 103 connecting the first surface 101 and the second surface 102, the first surface 101 is away from the base plate 110, and the second surface 102 faces the base plate 110. The first surface 101 includes a central region 105 and a peripheral region 104 surrounding the center region 105.

For a technical solution that the functional layer 140 is formed earlier than the first packaging layer 130, there may mainly be the following examples:

In a first implementation, with reference to FIG. 1, a step of forming the functional layer 140 includes forming the functional layer 140 on the side surface 103 and the first surface 101 of the peripheral region 104. That is, the side surface 103 and the first surface 101 of the peripheral region 104 may be directly coated with the material for the functional layer 140.

In a second implementation, with reference to FIG. 2, before the functional layer 140 is formed, a separation layer 160 may be formed on the side surface 103 and the first surface 101 of the peripheral region 104. That is, the side surface 103 and the first surface 101 of the peripheral region 104 may be first coated with the material for the separation layer 160. After the separation layer 160 is formed, the surface of the separation layer 160 may be coated with the material for the functional layer 140.

In a third implementation, with reference to FIG. 3, the functional layer 140 may further be formed on the first surface 101 of the central region 105, or the separation layer 160 may be first formed on the first surface 101 of the central region 105, and then the functional layer 140 may be formed on the separation layer 160 of the central region 105.

With further reference to FIGS. 1-3, after the functional layer 140 is formed, the cell string 100 may be coated around with the material for the first packaging layer 130 on the base plate 110 to form the first packaging layer 130.

It shall be noted that before the first packaging layer 130 is formed, a second packaging layer 170 may be formed on the base plate 110. In particular, the second packaging layer 170 is laid on the cell string 100, and the second packaging layer 170 shall completely cover the cell string 100 and the functional layer 140.

In a fourth implementation, with reference to FIG. 4, the second packaging layer 170 is formed on the first surface of the cell string 100. The functional layer 140 is formed around the cell string 100 and the second packaging layer 170 on the base plate 110. The first packaging layer 130 is formed around the functional layer 140 on the base plate 110.

In a fifth implementation, with reference to FIG. 7, the surface of the cell string 100 is coated with the functional layer 140, and the first packaging layer 130 is formed around the functional layer 140 on the base plate 110. That is, the functional layer 140 fills a space formed by the first packaging layer 130.

Example Two: with reference to FIG. 5 and FIG. 6, the first packaging layer 130 is formed earlier than the functional layer 140.

In a first implementation, with reference to FIG. 5, the first packaging layer 130 is first formed around the cell string 100 on the base plate 110, and partial inner wall surface of the first packaging layer 130 facing the cell string 100 on the base plate 110 is coated, i.e., only partial inner wall bordering with the base plate 110 is coated. Then the inner wall bordering with the cover plate 120 is coated to form the functional layer 140.

In a second implementation, with reference to FIG. 6, the first packaging layer 130 is formed around the cell string 100 on the base plate 110, and then the inner surface of the first packaging layer 130 facing the cell sting 100 is coated to form the functional layer 140.

It may be appreciated that before the first packaging layer 130 is formed, the second packaging layer 170 may further be laid on the base plate 110, the second packaging layer 170 covering the cell string 100 completely.

At step S402, the cover plate 120 is placed on the cell string 100, so that the cover plate 120, the base plate 110 and the first packaging layer 130 define a sealed space, the functional layer 140 is located within the sealed space.

At step S403, lamination is performed.

A lamination temperature shall not be higher than 150° C., for which reasons are: firstly, high-temperature resistance of perovskite is poor; secondly, the material for the functional layer 140 may be affected by a high temperature, resulting in cross linking, thereby degrading performance of moisture absorption. Therefore, a lamination temperature under 150° C. would ensure that performances of perovskite and the functional layer 140 are not damaged.

It may be appreciated that a packaging temperature may be determined according to particular materials for the first packaging layer 130, the second packaging layer 170 and the functional layer 140.

To sum up, in this embodiment, steps of forming the first packaging layer 130, the second packaging layer 170 and the functional layer 140 may be adjusted according to particular positions of the first packaging layer 130 and the functional layer 140, so that the functional layer 140 is located within a sealed space defined by the first packaging layer 130, the cover plate 120 and the base plate 110, ensuring that the functional layer 140 is converted to a solidified layer after absorbing moisture, thereby improving packaging effect of the photovoltaic module.

A fifth embodiment of the present disclosure provides a photovoltaic module substantially identical with the photovoltaic module provided in the previous embodiments, but a main difference lies in: in the fifth embodiment, because the functional layer is converted into a solidified layer after absorbing moisture, the photovoltaic module has a solidified layer rather than a functional layer. It may be appreciated that limitation on the position of the functional layer in the previous embodiments also applies to the solidified layer. A limitation on a particular position of the solidified layer is not stated in detail in the following to avoid repetition. In the following, the photovoltaic module provided in the fifth embodiment of the present disclosure is described with reference to the drawings.

Figure 18:
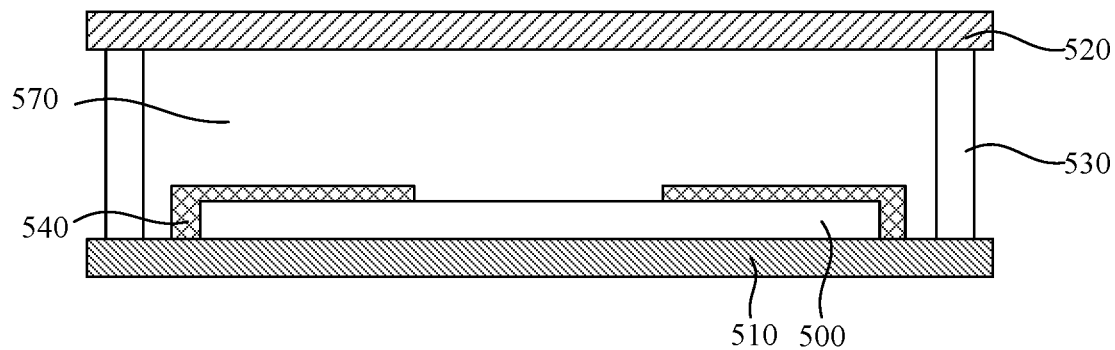
FIG. 18 is a schematic diagram showing a structure of a photovoltaic module provided in a fifth embodiment of the present disclosure.

With reference to FIG. 18, in this embodiment, the photovoltaic module includes: a base plate 510, a cell string 500 and a cover plate 520 stacked in order; a first packaging layer 530 located between the base plate 510 and the cover plate 520 and surrounding the cell string 500, the first packaging layer 530, the base plate 510 and the cover plate 520 defining a third sealed space 570; and a solidified layer 540 located within the third sealed space 570. A material for the solidified layer 540 may be a material converted from a hydrolyzable and crosslinkable material after absorbing moisture.

For particular description on the base plate 510, the cell string 500, the cover plate 520 and the first packing layer 530, the previous embodiments may be referred to and is not repeated here.

Herein, the solidified layer 540 is at least located between the first packing layer 530 and the cell string 500. For a particular position of the solidified layer 540, the limitation on the position of the functional layer in the previous embodiments also applies to the solidified layer 540.

In particular, the material for the solidified layer 540 may either be a material converted from a hydrolyzable and crosslinkable material after absorbing moisture, or a hydrolyzable and crosslinkable material. In addition, degrees of cross linking vary in different regions of the solidified layer 540. For example, a degree of cross linking of the solidified layer 540 facing the cover plate and the first packaging layer 530 is greater than that of a region facing the cell string 500. The degrees of cross linking of the solidified layer 540 may alternatively be identical in different regions.

In the photovoltaic module, the solidified layer 540 may serve as a second packaging function on the cell string 500, which is advantageous for further improving tightness of the cell string.

A sixth embodiment of the present disclosure provides a photovoltaic module. With reference to FIGS. 19-27, the photovoltaic module includes: a base plate 610, a cell string 600 and a cover plate 620 stacked in order; a first packaging layer 630 located between the base plate 610 and the cover plate 620 and surrounding the cell string 600, the first packaging layer 630, the base plate 610 and the cover plate 620 defining a first sealed space; a moisture detection layer 640 located in the first sealed space. It is detected and determined whether there is moisture in the first sealed space through response information of the moisture detection layer 640.

A further description is provided in details in the following with reference to the drawings.

In this embodiment, the base plate 610 may be a conductive substrate, and the cell string 600 may include a plurality of perovskite solar cells. That is, in this embodiment, the base plate 610 can not only bear the cell string 600, but also can serve as an anode to collect electrons generated by the cell string 600 after light exposure. The base plate 610 may be fluorine-doped tin oxide conductive glass or indium tin oxide conductive glass. That is, the base plate 610 may be taken as conductive glass of the cell string 600.

In this embodiment, the cell string 600 is a perovskite solar cell film layer including such structures as a hole transport layer, a perovskite layer, an electron transport layer and a metal electrode. When exposed to sunlight, the perovskite layer first absorbs photons to generate electron-hole pairs. Un-recombined electrons and holes are separately collected by the electron transport layer and the hole transport layer. That is, the electrons are transmitted from the perovskite layer to the electron transport layer and finally collected by the base plate 610; the holes are transmitted from the perovskite layer to the hole transport layer and finally collected by the metal electrode. At last, photocurrent is generated through a circuit connecting the base plate 610 and the metal electrode. Because a perovskite material has a low carrier recombination probability and a high carrier transferring rate, a diffusion distance and a life of a carrier are relatively long. Therefore, the perovskite solar cell has a high photoelectric conversion efficiency.

In another embodiment, the cell string may further include such cell film layers as gallium arsenide, copper indium selenium or cadmium telluride layers.

It may be appreciated that the cell string 600 is of a cell structure formed by a plurality of solar cells connected in parallel or in series.

In this embodiment, the cover plate 620 may be glass. In another embodiment, the cover plate may be transparent plastic.

The first packaging layer 630 may be located between the base plate 610 and the cover plate 620, surrounding the cell string 600. The first packaging layer 630, the base plate 610 and the cover plate 620 define a first sealed space.

A material for the first packaging layer 630 may be a moisture-solidified material, a light-solidified material or an additive-curing material, for example, polyisobutylene, polyolefin or polyurethane. Because the perovskite solar cell is not resistant to a high temperature, temperature should not be too high during a lamination process of the photovoltaic module. If the first packaging layer 630 is a thermos-solidified material, it is difficult for the temperature during the lamination process to reach a temperature at which the first packaging layer 630 is solidified, thus the first packaging layer 630 may not be solidified completely, resulting in inadequate packaging. Therefore, the moisture-solidified material, the light-solidified material or the additive-curing material are used for the first packaging layer 630 to avoid the above problem. In this way, the first packaging layer 630 may be solidified well without a high temperature.

A width of the first packaging layer 630 in a direction parallel to a surface of the base plate 610 is 3 mm-500 mm. It shall be noted that if a width of the first packaging layer 630 is too small, it would be easy for a problem of inadequate packaging to occur; but if the width is too large, an area of the photovoltaic module would be increased. Therefore, the above two problems may be avoided if the width of the first packaging layer 630 is 3 mm-500 mm.

With reference to FIGS. 19 to 24 and 26 to 27, in this embodiment, the first sealed space may be further filled with a second packaging layer 670.

The second packaging layer 670 may further enhance sealing to avoid moisture intrusion.

A material for the second packaging layer 670 differs from that of the first packaging layer 630, and may be an ethylene vinyl acetate (EVA) film layer.

In another embodiment, the material for the second packaging layer 670 may be identical with that of the first packaging layer 630. Alternatively, there may not be a second packaging layer in the first sealed space, i.e., there is a gap in the first sealed space.

The response information of the moisture detection layer 640 may be color information or photoelectrical information. The color information is taken as an example. The response information includes a first response information and a second response information. The first response information is that color remains unchanged. The second response information is that color changes. If there is no moisture in the first sealed space, the moisture detection layer 640 sends out or displays the first response information. If a problem that packaging is not tight or a material ages occurs to the first packaging layer 630 or the second packaging layer 670, moisture enters the first sealed space, and the moisture detection layer sends out or displays the second response information. Therefore, an operator may determine whether there is moisture in the first sealed space according to the response information of the moisture detection layer 640. If there is moisture, the photovoltaic module is re-packaged, thereby preventing the cell string 600 from being decomposed or ceasing to be effective in moisture.

The moisture detection layer 640 is further adaptive to locate a position where the moisture is located in the first sealed space. In particular, the moisture detection layer 640 may be arranged in different positions of the first sealed space, and the positions of the moisture may be located according to detection results at different positions of the moisture detection layer 640.

In this embodiment, the moisture detection layer 640 includes a moisture absorption color changeable layer. The moisture absorption color changeable layer changes its color after absorbing moisture. According to the change state of color, it may be determined whether there is moisture in the first sealed space. In addition, a particular position of the moisture may be determined according to a particular position of color change of the moisture absorption color changeable layer. Materials for the moisture absorption color changeable layer may be: copper sulfate, cobalt chloride, methylene amines or organic phenols. Take copper sulfate for example, the copper sulfate is grey-white before absorbing water, but is blue after absorbing water. Therefore, when the moisture absorption color changeable layer changes from white to blue, the operator may determine that there is moisture in the first sealed space and perform re-packaging on the photovoltaic module.

In another embodiment, the moisture detection layer 640 may further be a moisture-sensitive resistor or a moisture-sensitive sensor. Resistance of the moisture-sensitive resistor may change after absorbing moisture, and based on the change, it may be determined whether there is moisture in the first sealed space. The moisture-sensitive sensor may convert humidity to a signal to be sent out. Based on the signal, it may be determined whether there is moisture in the first sealed space. In addition, a plurality of moisture-sensitive resistors or moisture-sensitive sensors may be arranged in the first sealed space as separated from each other. A particular position of the moisture may be determined in regard to resistance value changes of the moisture-sensitive resistors or signal changes of the moisture-sensitive sensors in different positions.

Figure 19:
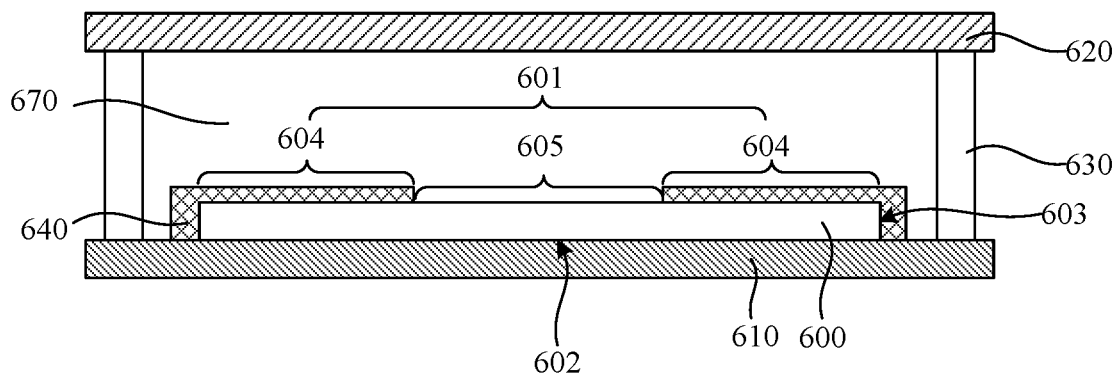
FIG. 19-27 are schematic diagrams showing structures of a photovoltaic module provided in a sixth embodiment of the present disclosure.

Technical solutions for particular positions of the moisture detection layer 640 in the first sealed space, the following examples are mainly included:

Example One: with reference to FIG. 19, the cell string 600 has a first surface 601 and a second surface 602 opposite each other, and a side surface 603 connecting the first surface 601 and the second surface 602, the first surface 601 is away from the base plate 610, and the second surface 602 faces the base plate 610; and the first surface 601 includes a central region 605 and a peripheral region 604 surrounding the central region 605, and the moisture treatment layer 640 is located on the side surface 603 and on a first surface 601 of the peripheral region 604; the moisture treatment layer 640 is attached to the side surface 603 and the first surface 601 of the peripheral region 604.

Figure 20:
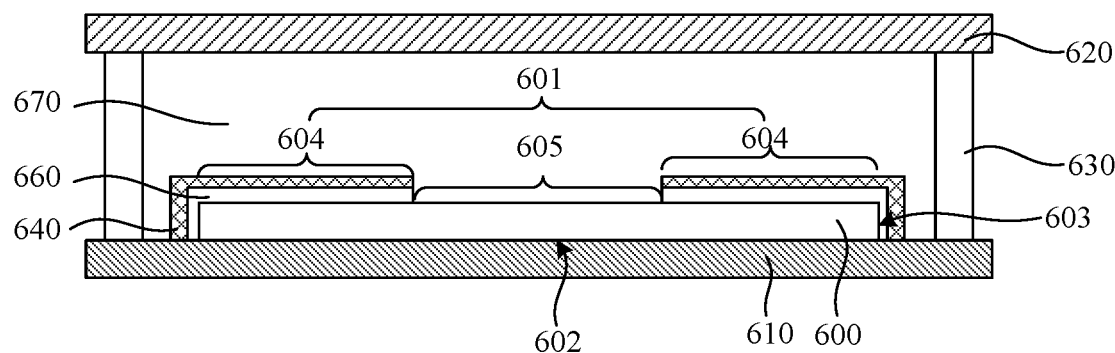

Example Two: with reference to FIG. 20, the photovoltaic module further includes a separation layer 660 located on the side surface 603 and the first surface 601 of the peripheral region 604, and the separation layer 660 is located between the moisture detection layer 640 and the cell string 600.

The separation layer 660 can further improve tightness of the package, and the separation layer 660 can also separate the moisture detection layer 640 from the cell string 600. If the material used for the moisture detection layer 640 may react with the material for the cell string 600, the separation layer 660 can prevent the moisture detection layer 640 from having an adverse effect on the cell string 600 and improve life of the cell string 600. A material for the separation layer 660 may be an EVA film.

Example Three: Example Three: with reference to FIG. 21, the moisture detection layer 640 is further located on the first surface 601 of the central region 605. That is, the moisture detection layer 640 is located on the side surface 603 and the first surface 601 of the cell string 600. A separation layer 660 is further included between the moisture detection layer 640 and the cell string 600. It may be appreciated that the moisture detection layer 640 can further be directly attached to the side surface 603 and the first surface 601 of the cell string 600, that is, there is no separation layer 660 between the moisture detection layer 640 and the cell string 600.

Figure 22:
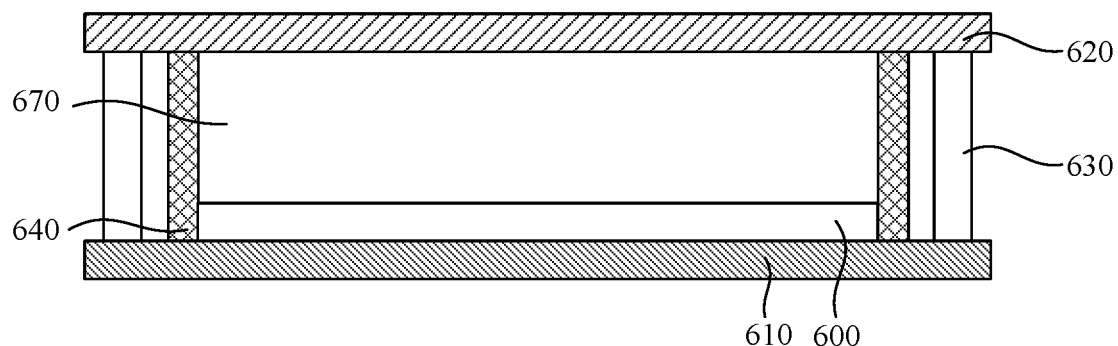

Example Four: with reference to FIG. 22, the moisture detection layer 640 is arranged around the cell string 600, and the moisture detection layer 640, the base plate 610 and the cover 620 define a second sealed space. That is, the moisture detection layer 640 is arranged around the side surface 603 of the cell string 600 and encloses the cell string 600 in the second sealed space.

The moisture detection layer 640 may be arranged close to a side surface of the cell string 600, or there may be a gap between the moisture detection layer 640 and the side surface of the cell string 600; or there may be a separation layer between the moisture detection layer 640 and the side surface 603 of the cell string 600.

Figure 23:
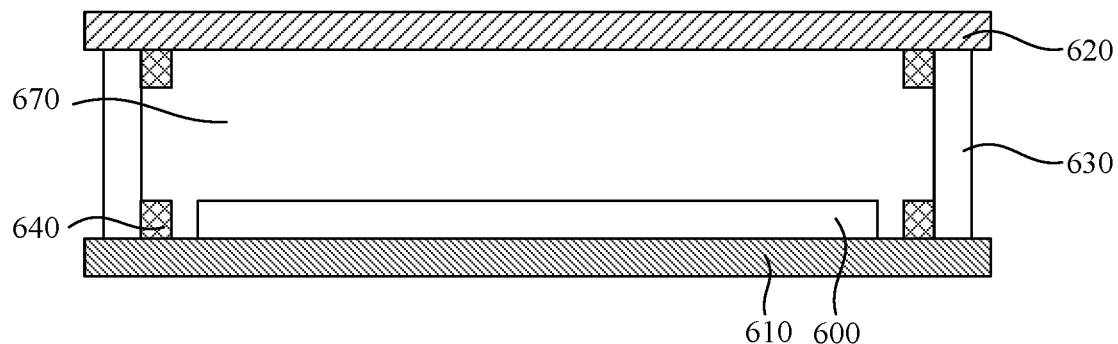

Example Five: with reference to FIG. 23, there are corner junction regions between the first packaging layer 630 and the base plate 610, and between the first packaging layer 630 and the cover plate 620, and the moisture detection layer 640 is located at least in the corner junction regions. That is, the moisture detection layer 640 covers a boundary between the first packaging layer 630 and the cover plate 620 and the base plate 610.

Figure 24:
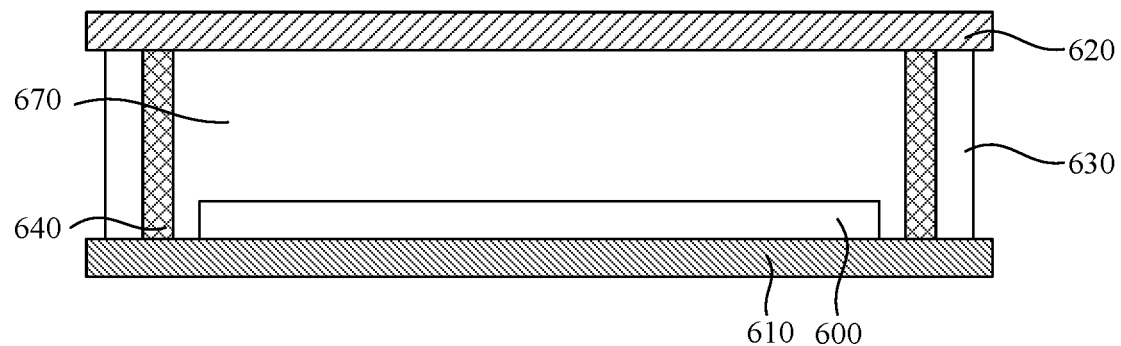

Example Six: with reference to FIG. 24, the moisture detection layer 640 is further located on an inner wall surface of the first packaging layer 630 facing the cell string 600.

Figure 25:
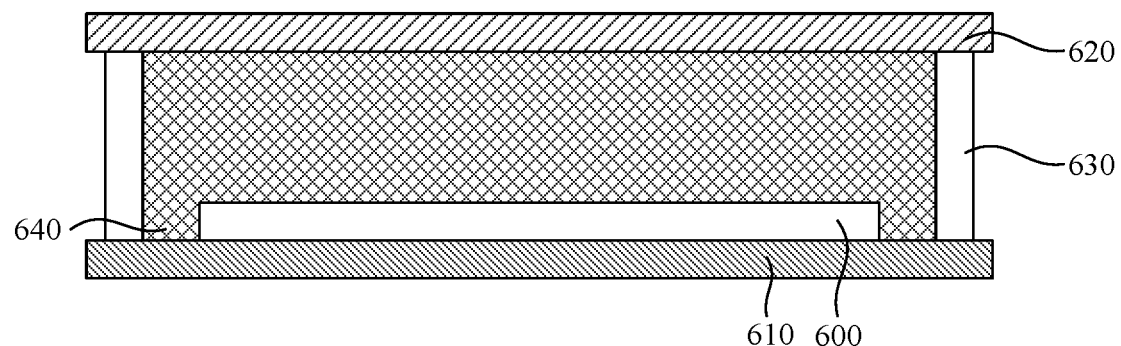

Example Seven: with reference to FIG. 25, the moisture detection layer 640 fills the first sealed space. At this time, the moisture detection layer 640 completely covers the cell string 600, and the moisture detection layer 640 has a great thickness and can perform sealing well.

It shall be noted that in the Examples One to Seven, the moisture detection layer 640 is at least located between the first packaging layer 630 and the cell string 600. If the first packaging layer 630 or the second packaging layer 670 is not packaged tightly or their packaging ages, a position between the first packaging layer 630 and the cell string 600 is the first position where moisture enters. Therefore, by arranging the moisture detection layer 640 between the first packaging layer 630 and the cell string 600, a speed of moisture detection can be increased.

Figure 26:
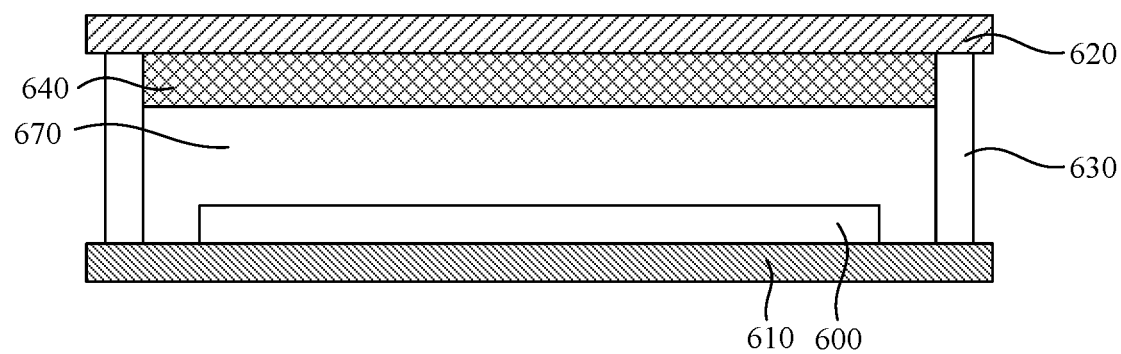

Example Eight: with reference to FIG. 26, the moisture detection layer 640 is located between the cell string 600 and the cover plate 620.

Figure 27:
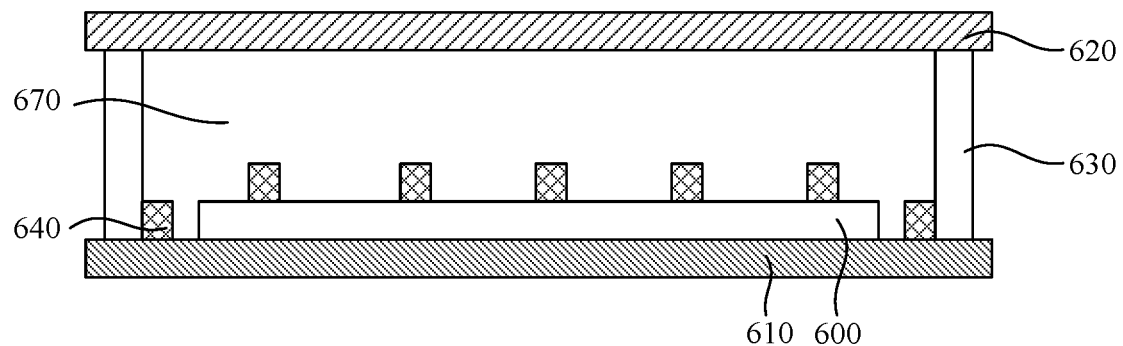

Example Nine: with reference to FIG. 27, there are a plurality of separated moisture detection layers 640 in the first sealed space, and each of the moisture detection layers 640 is a moisture detection point. Therefore, by detecting moisture through a color change of each moisture detection point, a position of the moisture may be accurately determined.

To sum up, there is a moisture detection layer 640 in the first sealed space of the photovoltaic module in this embodiment. It is detected and determined whether there is moisture in the first sealed space through response information of the moisture detection layer 640. In addition, the moisture detection layer 640 may locate a particular position of the moisture in the first sealed space. Therefore, the operator may perform re-packaging on the photovoltaic module according to the response information of the moisture detection layer 640, thereby preventing the cell string 600 from being decomposed and ceasing to work.

A seventh embodiment of the present disclosure provides a photovoltaic module substantially identical with the photovoltaic module provided in the sixth embodiment, but differs in that in this embodiment, a base plate is a bearing board and a cell string includes a plurality of perovskite solar cells. In this embodiment, the sixth embodiment may be referred to for portions identical or similar to the photovoltaic module provided in the six embodiment, and content of the portions is not repeated. FIGS. 27-34 are schematic diagrams showing structures of a photovoltaic module provided in this embodiment.

Detailed description is provided in the following with reference to the drawings.

With reference to FIGS. 28-36, the photovoltaic module includes: a base plate 710, a cell string 700 and a cover plate 720 stacked in order; a first packaging layer 730 located between the base plate 710 and the cover plate 720 and surrounding the cell string 700, the first packaging layer 730, the base plate 710 and the cover plate 720 defining a first sealed space; a moisture detection layer 740 located in the first sealed space. It is detected and determined whether there is moisture in the first sealed space through response information of the moisture detection layer 740.

In this embodiment, the base plate 710 is a bearing board and the cell string 700 includes a plurality of perovskite solar cells. That is, the base plate 710 is adaptive to bear a cell string but does not have a function of collecting electrons. The base plate 710 may be glass or transparent plastic.

The cell string 700 includes a conductive glass 702 and a perovskite solar cell film layer 701. As an anode of the perovskite solar cell, the conductive glass 702 is used for collecting electrons.

With reference to FIGS. 28-34, there is a second packaging layer 770 between the cell string 700 and the base plate 710. The second packaging layer 770 may improve tightness of packaging.

It may be appreciated that the cell string 700 may be directly placed on the base plate 710; or that there may be a moisture detection layer and/or a second packaging layer between the cell string 700 and the base plate 710.

Figure 28:
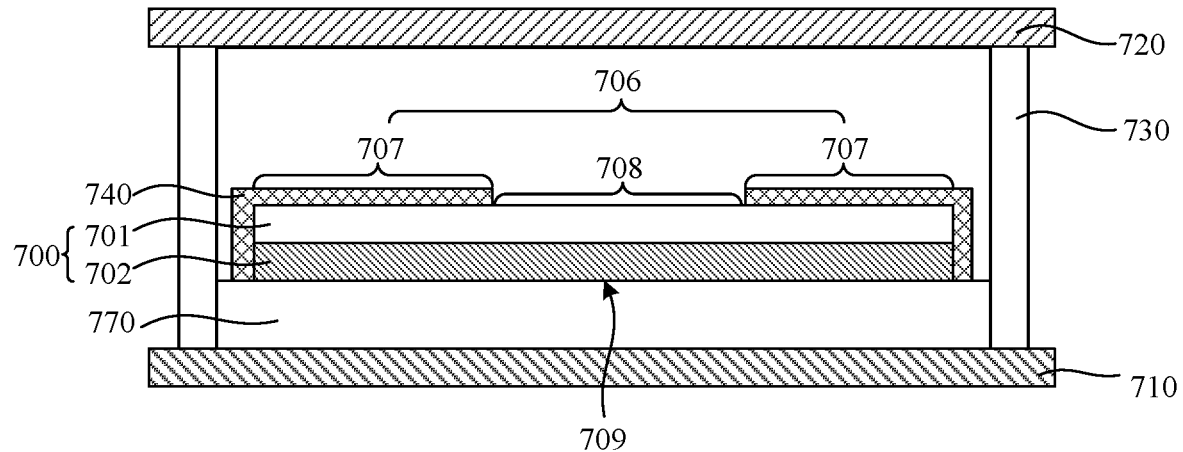
FIG. 28-36 are schematic diagrams showing structures of a photovoltaic module provided in a seventh embodiment of the present disclosure.

For technical solutions about a particular position of the moisture detection layer 740 in the first sealed space, the following examples are mainly included:

Example One: with reference to FIG. 28, the perovskite film layer 701 has a first surface 706 away from the base plate 710 and a second surface 709 facing the base plate 710, the first surface 706 including a central region 708 and a peripheral region 707. The moisture detection layer 740 is attached to a side surface of the perovskite film layer 701, the first surface 706 of the peripheral area 707 and a side surface of the conductive glass 702. The perovskite film layer 701 is arranged as being closely attached to the conductive glass 702, thus the moisture detection layer 740 is further formed on the side surface of the conductive glass 702, thereby improving accuracy of moisture detection around the perovskite film layer 701.

Figure 29:
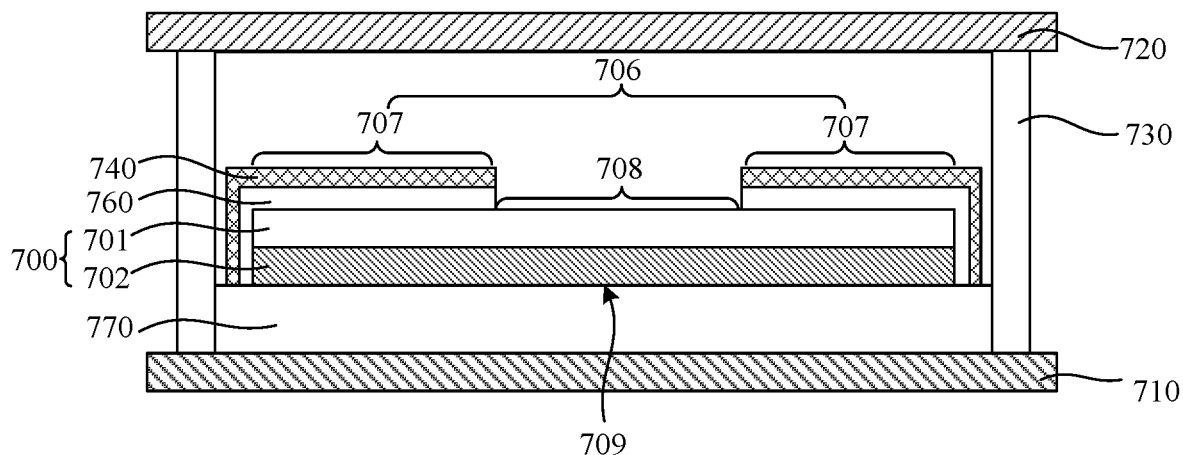

Example Two: with reference to FIG. 29, the photovoltaic module further includes a separation layer 760 located on the side surface of the perovskite film layer 701, the first surface 706 of the peripheral area 707 and the side surface of the conductive glass 702. The separation layer 760 is located between the moisture detection layer 740 and the cell string 700.

Figure 30:
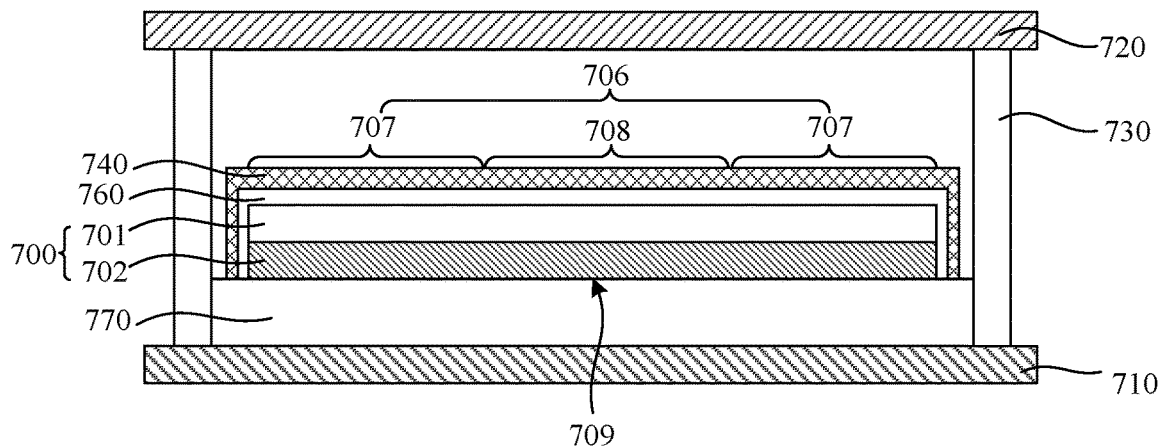

Example Three: with reference to FIG. 30, the moisture detection layer 740 is further located on the first surface 706 of the central region 708 of the perovskite film layer 701.

Figure 31:
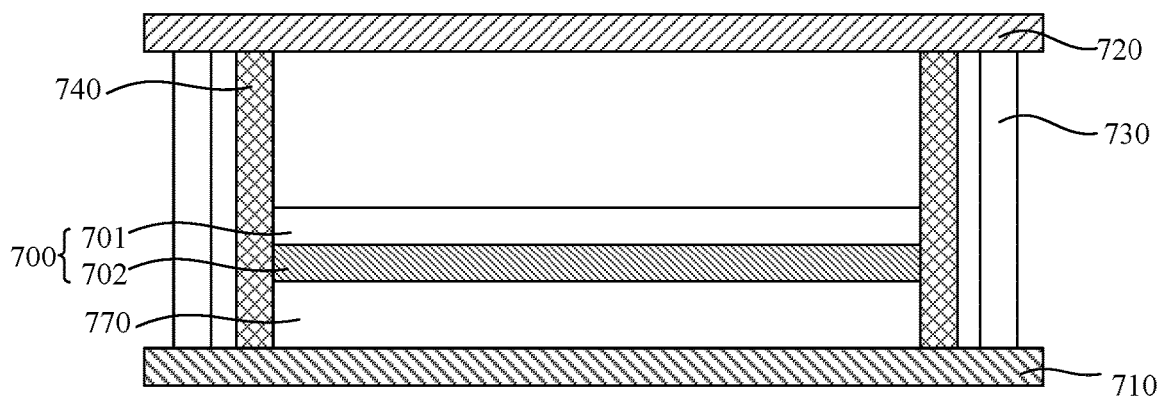

Example Four: with reference to FIG. 31, the moisture detection layer 740 is arranged as surrounding the second packaging layer 770, the perovskite film layer 701 and the conductive glass 702. The moisture detection layer 740, the base plate 710 and the cover plate 720 define a second sealed space.

Figure 32:
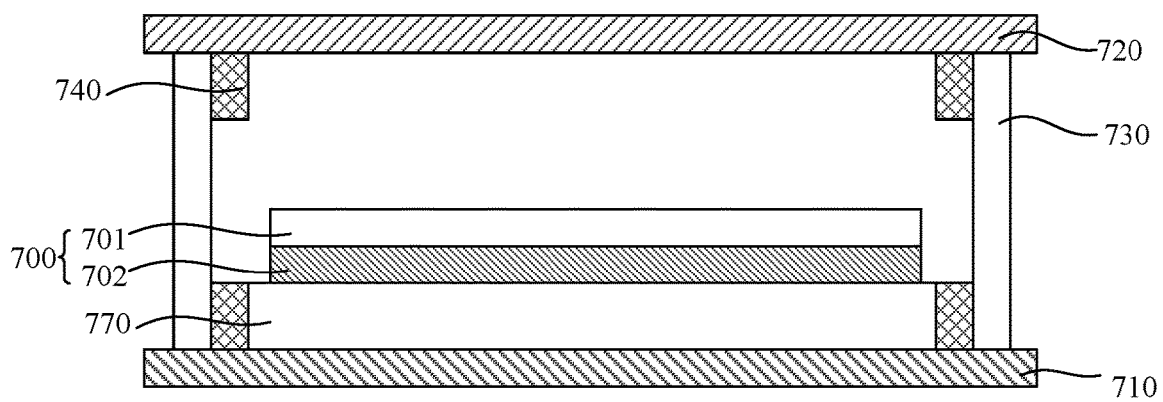

Example Five: with reference to FIG. 32, the moisture detection layer 740 is located at corner junction regions between the first packaging layer 730 and the cover plate 720, and between the first packaging layer 730 and the base plate 710.

Figure 33:
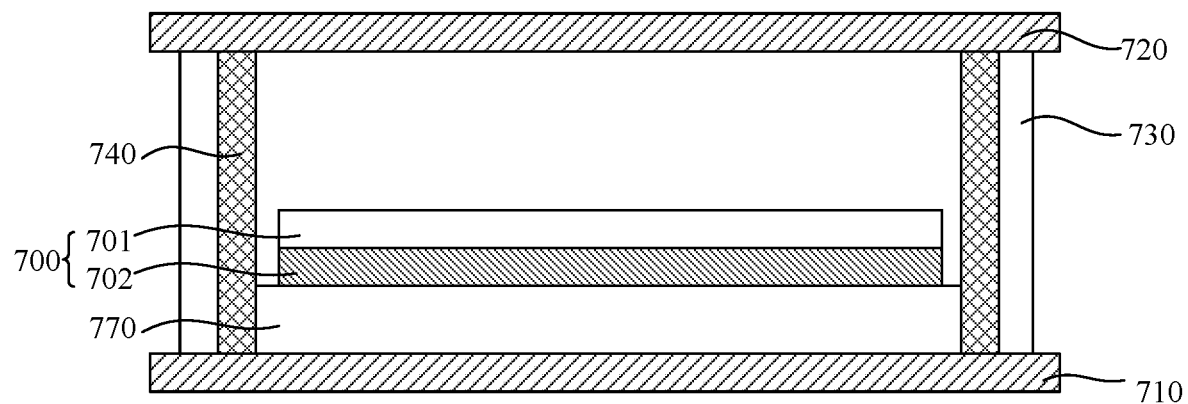

Example Six: with reference to FIG. 33, the moisture detection layer 740 is further located on an inner wall surface of the first packaging layer 730 facing the cell string 700.

Figure 34:
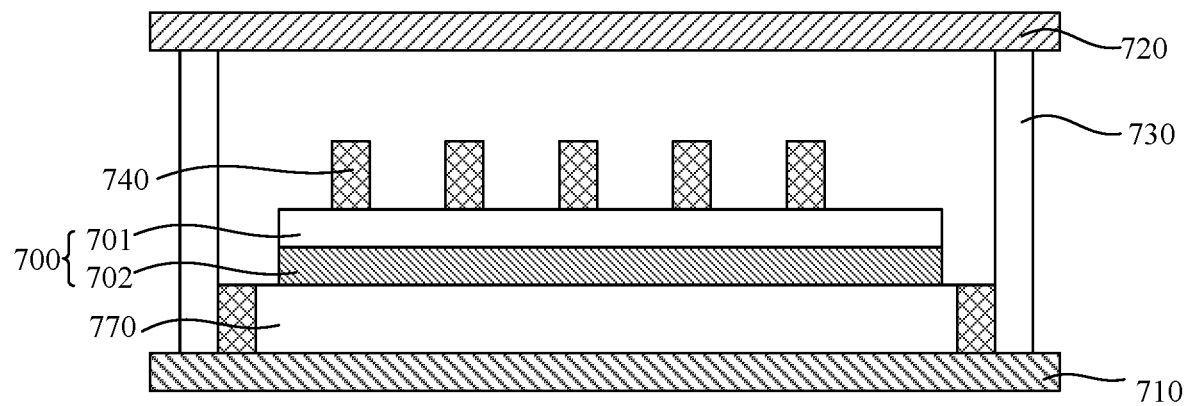

Example Seven: with reference to FIG. 34, there are a plurality of moisture detection layers 740 arranged separately in the first sealed space and each of the moisture detection layers 740 is a moisture detection point. Therefore, through color changes of moisture detection points in different positions, a particular position of the moisture may be accurately determined.

Figure 35:
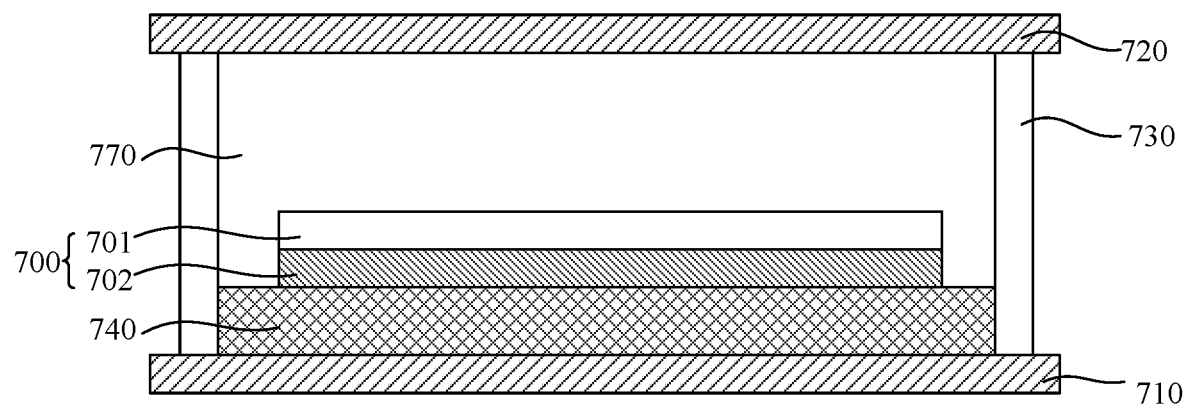

Example Eight: with reference to FIG. 35, the moisture detection layer 740 is located between the cell string 700 and the base plate 710 to locate moisture here. It shall be noted that because light enters the cell string 700 at a side of the base plate 710, the moisture detection layer 740 located between the base plate 710 and the cell string 700 shall be high in light transparency rate, thereby avoiding the reduction of a light absorption rate of the cell string 700.

Figure 36:
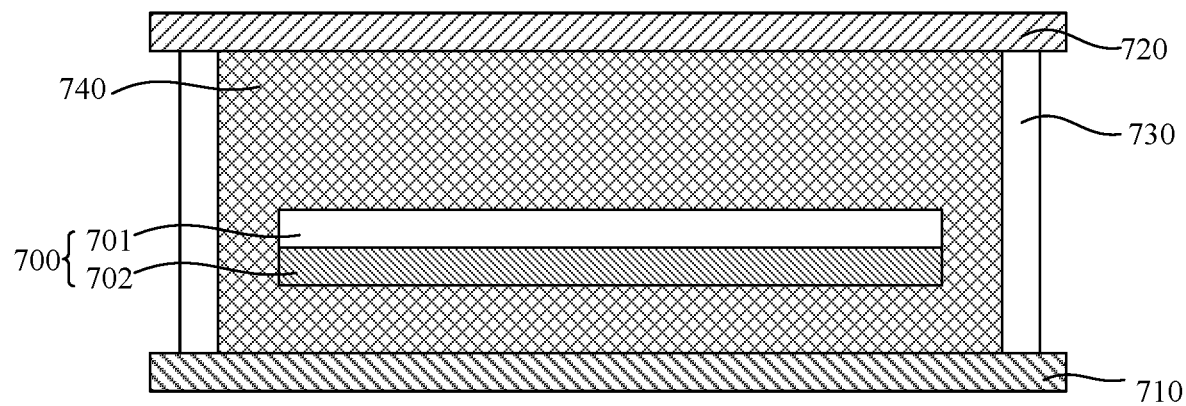

Example Nine: with reference to FIG. 36, the moisture detection layer 740 fills the first sealed space. At this time, the moisture detection layer 740 completely covers the cell string 700.

To sum up, the base plate 710 of the photovoltaic module provided in this embodiment is a bearing board. A second packaging layer 770 may be provided between the bearing board and the cell string 700 to improve the tightness of the package. The moisture detection layer 740 may be arranged between the bearing board and the cell string 700, so as to locate moisture here, thereby prompting an operator to perform re-packaging on the photovoltaic module.

Figure 37:
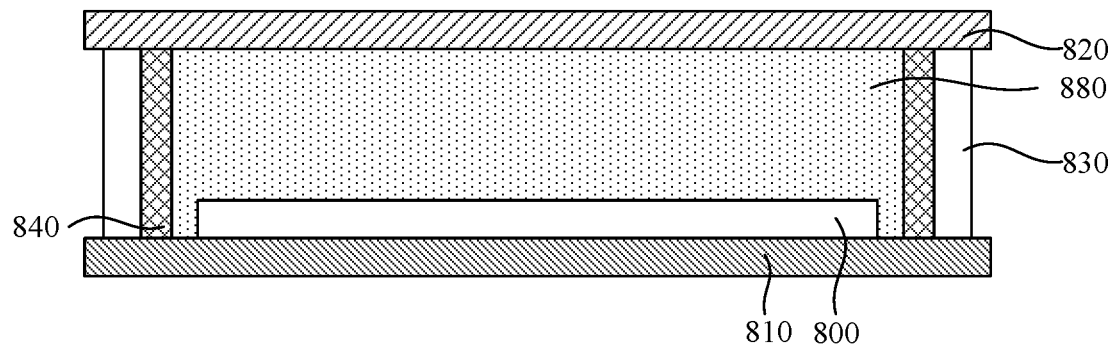
FIG. 37-38 are schematic diagrams showing structures of a photovoltaic module provided in an eighth embodiment of the present disclosure.
Figure 38:
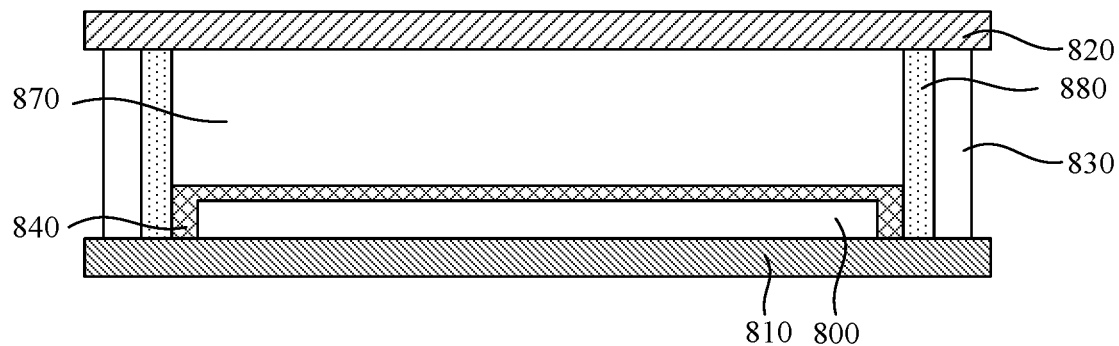

An eighth embodiment of the present disclosure provides a photovoltaic module substantially identical with the photovoltaic module provided in the sixth embodiment and the seventh embodiment. The photovoltaic module includes: a base plate, a cover plate, a cell string, a first packaging layer, a second packaging layer and a moisture detection layer. A main difference between this embodiment and previous embodiments lies in that the photovoltaic module provided in this embodiment includes a functional layer. For identical or similar portions of the photovoltaic module between this embodiment and the sixth and seventh embodiments, the sixth and seventh embodiments may be referred to and the content is not repeated here. FIGS. 37-38 are schematic diagrams showing structures of a photovoltaic module provided this embodiment.

With reference to FIGS. 37-38, a base plate 810 of a conductive substrate is taken as an example. It may be appreciated that the base plate 810 may be a bearing board. There is no limitation to a base plate in this embodiment.

A functional layer 880 is located within a sealed space. The functional layer 880 is adaptive to absorb moisture in the sealed space and be converted into a solidified layer having a degree of cross linking greater than a degree of cross linking of the functional layer. If either the first packaging layer 830 or the second packaging layer 870 is not packaged adequately or has aged material, the functional layer 880 may absorb moisture and be converted into a solidified layer. That is, the functional layer 880 may perform packaging on the cell string 800 for a second time, thereby preventing the cell string 800 from being decomposed or ceasing to be effective in moisture.

The degree of cross linking is further called cross linking index or cross linking density, and may be used to represent a degree of cross linking of a molecular chain. In particular, the degree of cross linking density refers to a fraction taken by a cross-linked structural unit of an entire structural unit. The degree of cross linking is proportional with the amount of cross link bonds: the greater the degree of cross linking, the more cross link bonds in a unit volume and the greater the cross linking density.

In this embodiment, a material for the functional layer 880 may be a hydrolyzable and crosslinkable material that can absorb moisture entering into the sealed space and that may have a cross-linking reaction after absorbing moisture. In this way, viscosity and compactness of the material are increased, and the second packaging may be performed.

The hydrolyzable and crosslinkable material may be silane modified polyurethane or silicone. In addition, the hydrolyzable and crosslinkable material may be either a single-component hydrolyzable and crosslinkable material or a double-component hydrolyzable and crosslinkable material.

In another embodiment, apart from the hydrolyzable and crosslinkable material, materials for the functional layer may further include a material that is already hydrolyzed and cross-linked.

For silane-modified polyurethane, a prepolymer thereof has an aminosilane end cap, and the prepolymer reacting with external moisture may produce a cross-linked network structure. In addition, an organic functional silane has multiple functions. Firstly, the silane acts as an adhesion promoter to improve bonding; secondly, in a crosslinking process, the silane can accelerate a reaction.

For silicone, a main polymer chain thereof is composed of silicon-oxygen-silicon bonds, and does not contain a structure that may be polymerized by heating. That is, even at a high temperature, silicone is not prone to polymerize. Therefore, in subsequent use or packaging, silicone is not easily affected by temperature and can maintain good moisture absorption and crosslinking properties.

It may be appreciated that different hydrolyzable and crosslinkable materials for the functional layer 880 may enable the functional layer 880 to have different reactions internally when the functional layer is converting to a solidified layer. For example, the functional layer 880 may have a hydrolysis reaction, a polycondensation reaction, a cross-linking reaction, or an oligomerization reaction and the like. For example, when the material for the functional layer 880 is silane-modified polyurethane, the functional layer 880 undergoes a cross-linking reaction, and the number of Si—O—Si bonds in the solidified layer is greater than the number of Si—O—Si bonds in the functional layer 880. In another example, the compactness of the solidified layer may further be greater than the compactness of the functional layer.

In addition, it shall further be noted that the functional layer 880 absorbs moisture in the sealed space and is converted into a solidified layer, including: a partial region of the functional layer 880 absorbs moisture to be converted into a solidified layer. Alternatively, all of the functional layer 880 absorbs moisture to be converted into a solidified layer.

For technical solutions about a particular position of the functional layer 880 in the sealed space, the following examples are mainly included:

Example One: with reference to FIG. 37, a moisture detection layer 840 is located on an inner wall of the first packaging layer 830 facing the cell string 800. The moisture detection layer 840, the cover plate 820 and the base plate 810 define a sealed space, and the functional layer 880 fills the closed space.

Example Two: with reference to FIG. 38, the functional layer 880 is located on an inner wall of the first packaging layer 830 facing the cell string 800. The functional layer 880, the cover plate 820 and the base plate 810 define a sealed space, and the sealed space is filled with the second packaging layer 870.

It may be appreciated that the functional layer 880 may further be located at another position in the sealed space, and this embodiment does not put a limitation to a position of the functional layer 880.

To sum up, the functional layer 880 provided in this embodiment has a functional layer 880 capable of absorbing moisture in the sealed space and being converted into a solidified layer after absorption to block moisture from entering the cell string 800, thereby implementing a second packaging. In addition, there is the moisture detection layer 840 in the sealed space. The moisture detection layer 840 can detect and locate a particular position of moisture to facilitate an operator performing re-packaging on the photovoltaic module.

Figure 39:
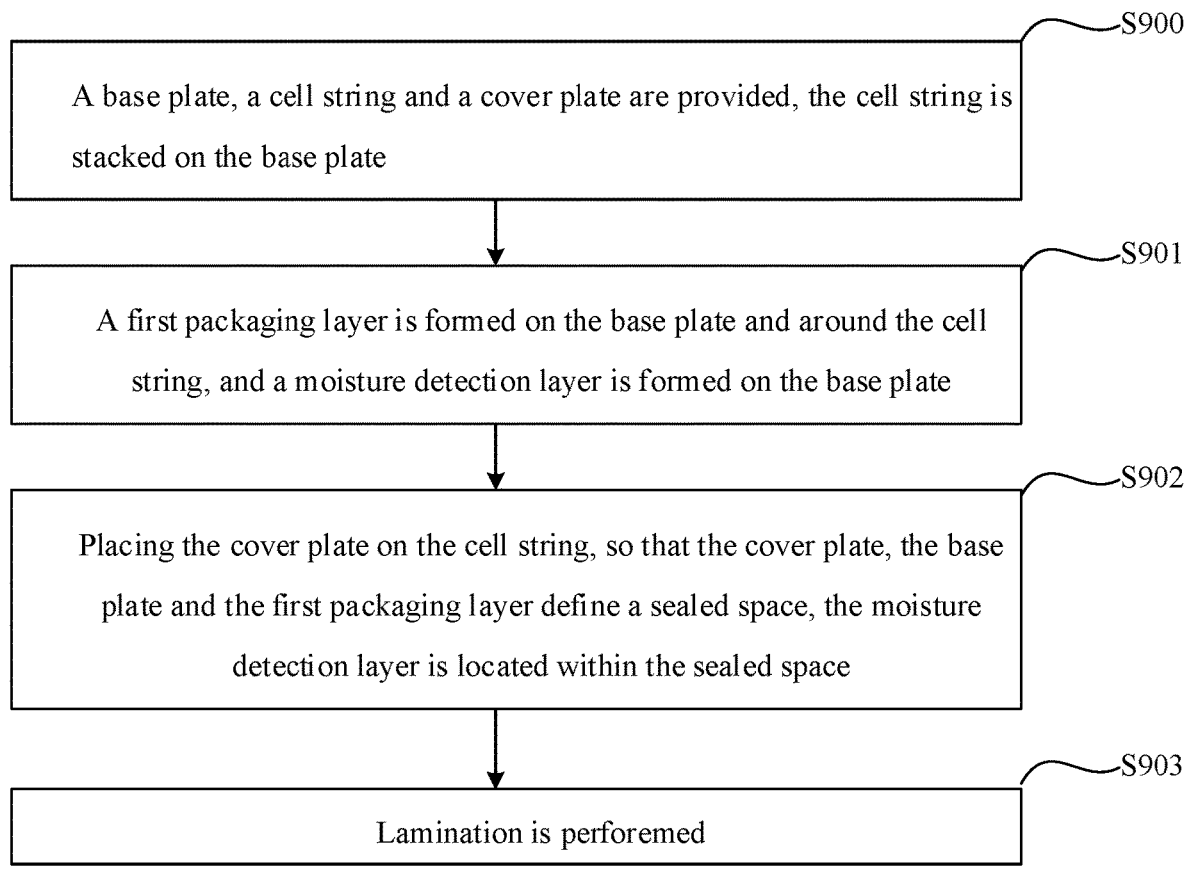
FIG. 39 is a flowchart showing a manufacturing method of a photovoltaic module provided in a ninth embodiment of the present disclosure.

A ninth embodiment of the present disclosure provides a manufacturing method for a photovoltaic module. FIG. 39 is a flowchart showing a manufacturing method of a photovoltaic module provided in this embodiment of the present disclosure.

With reference to FIG. 39 and FIGS. 19-27, at step S900, the base plate 610, the cell string 600 and the cover plate 620 are provided. The cell string 600 is stacked on the base plate 610.

In this embodiment, the base plate 610 may be a conductive substrate, the cell string 600 is a perovskite solar cell film layer, and the cell string 600 is attached to the surface of the base plate 610.

In another embodiment, a base plate 610 may be a bearing board, a cell string 600 may include a plurality of perovskite solar cells, and the cell string includes a conductive base plate and a perovskite solar cell film layer. The cell string may be attached to the base plate, or a functional layer and/or second packaging layer may be arranged between the cell string and the base plate.

It shall be noted that manufacturing of a photovoltaic module shall be performed in inert gas to prevent moisture in the outside from damaging the cell string.

At step S901, the first packaging layer 630 is formed on the base plate 610 and around the cell string 600, and the moisture detection layer 640 is formed on the base plate 610.

A height of the first packaging layer 630 is higher than a height of the cell string 600 to guarantee that the cell string 600 is in a space completely sealed after the cover plate 620 is placed.

In this embodiment, the moisture detection layer 640 is a moisture absorption color changeable layer. In another embodiment, a moisture detection layer may be a moisture-sensitive resistor or a moisture-sensitive sensor.

It may be appreciated that an order of forming the first packaging layer 630 and the moisture detection layer 640 is not fixed, but need to be adjusted according to a particular position arranged for the moisture detection layer 640.

For a technical solution for forming the first packaging layer 630 and the moisture detection layer 640, there may mainly be the following examples:

Example One: with reference to FIGS. 19-22 and 25-27, the moisture detection layer 640 is formed earlier than the first packaging layer 630.

The cell string 600 has a first surface 601 and a second surface 602 opposite to each other and a side surface 603 connecting the first surface 601 and the second surface 602, the first surface 601 is away from the base plate 610, and the second surface 602 faces the base plate 610. The first surface 601 includes a central region 605 and a peripheral region 604 surrounding the center region 605.

For a technical solution that the moisture detection layer 640 is formed earlier than the first packaging layer 630, there may mainly be the following examples:

In a first implementation, with reference to FIG. 19, a step of forming the moisture detection layer 640 includes forming the moisture detection layer 640 on the side surface 603 and the first surface 601 of the peripheral region 604. That is, the side surface 603 and the first surface 601 of the peripheral region 604 may be directly coated with the material for the moisture detection layer 640.

In a second implementation, with reference to FIG. 20, before the moisture detection layer 640 is formed, a separation layer 660 may be formed on the side surface 603 and the first surface 601 of the peripheral region 604. That is, the side surface 603 and the first surface 601 of the peripheral region 604 may be first coated with the material for the separation layer 660. After the separation layer 660 is formed, the surface of the separation layer 660 may be coated with the material for the moisture detection layer 640.

Figure 21:
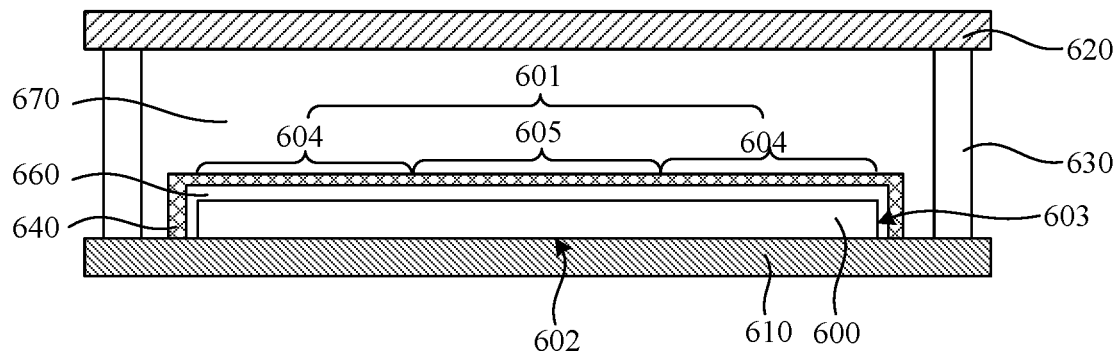

In a third implementation, with reference to FIG. 21, the moisture detection layer 640 may further be formed on the first surface 601 of the central region 605, or the separation layer 660 may be first formed on the first surface 601 of the central region 605, and then the moisture detection layer 640 may be formed on the separation layer 660 of the central region 605.

With further reference to FIGS. 19-21, after the moisture detection layer 640 is formed, the cell string 600 may be coated around with the material for the first packaging layer 630 on the base plate 610 to form the first packaging layer 630.

It shall be noted that before the first packaging layer 630 is formed, a second packaging layer 670 may be formed on the base plate 610. In particular, the second packaging layer 670 is laid on the cell string 600, and the second packaging layer 670 shall completely cover the cell string 600 and the moisture detection layer 640.

In a fourth implementation, with reference to FIG. 22, the second packaging layer 670 is formed on the first surface of the cell string 600. The moisture detection layer 640 is formed around the cell string 600 and the second packaging layer 670 on the base plate 610. The first packaging layer 630 is formed around the moisture detection layer 640 on the base plate 610.

In a fifth implementation, with reference to FIG. 25, the surface of the cell string 600 is coated with the moisture detection layer 640, and the first packaging layer 630 is formed around the moisture detection layer 640 on the base plate 610. That is, the moisture detection layer 640 fills a space formed by the first packaging layer 630.

In a sixth implementation, with reference to FIG. 26, the surface of the cell string 600 is covered with the second packaging layer 670, the moisture detection layer 640 is formed on an upper surface of the second packaging layer 670, and the first packaging layer 630 is formed around the second packaging layer 670 and the moisture detection layer 640 on the base plate 610.

In a seventh implementation, with reference to FIG. 27, separated moisture detection layers 640 are arranged on the base plate 610 and on the surface of the cell string 600. After the moisture detection layer 640 is formed, the first packaging layer 630 is formed around the second packaging layer 670 and the moisture detection layer 640 on the base plate 610.

Example Two, with reference to FIGS. 23 and 24, the first packaging layer 630 is formed earlier than the moisture detection layer 640.

In a first implementation, with reference to FIG. 23, the first packaging layer 630 is first formed around the cell string 600 on the base plate 610, and partial inner wall surface of the first packaging layer 630 facing the cell string 600 on the base plate 610 is coated, i.e., only partial inner wall bordering with the base plate 610 is coated. Then the inner wall bordering with the cover plate 620 is coated to form the moisture detection layer 640.

In a second implementation, with reference to FIG. 24, the first packaging layer 630 is formed around the cell string 600 on the base plate 610, and then the inner surface of the first packaging layer 630 facing the cell sting 600 is coated to form the moisture detection layer 640.

It may be appreciated that before the first packaging layer 630 is formed, the second packaging layer 670 may further be laid on the base plate 610, the second packaging layer 670 covering the cell string 600 completely.

At step S902, the cover plate 620 is placed on the cell string 600, so that the cover plate 620, the base plate 610 and the first packaging layer 630 define a sealed space, the moisture detection layer 640 is located within the sealed space.

At step S903, lamination is performed.

Because high-temperature resistance of perovskite is poor, a lamination temperature shall not be higher than 150° C.

It may be appreciated that a packaging temperature may be determined according to particular materials for the first packaging layer 630, the second packaging layer 670 and the moisture detection layer 640.

To sum up, in this embodiment, steps of forming the first packaging layer 630, the second packaging layer 670 and the functional layer 640 may be adjusted according to particular positions of the first packaging layer 630 and the functional layer 640, so that the functional layer 640 is located within a sealed space defined by the first packaging layer 630, the cover plate 620 and the base plate 610, and ensuring that the functional layer 640 can detect and locate moisture in the sealed space.

Those of ordinary skill in the art can understand that the above-mentioned embodiments are specific examples for implementing the present disclosure. In practice, various changes can be made in form and details without departing from the spirit and scope of the present disclosure. Any person skilled in the art can make changes and amendments without departing from the spirit and scope of the present disclosure. Therefore, the protection scope of the present disclosure should be subject to the scope defined in the Claims.

What is claimed is:

1. A photovoltaic module comprising:
a base plate, a cell string and a cover plate stacked in order;
a first packaging layer, located between the base plate and the cover plate and surrounding the cell string, the first packaging layer, the base plate and the cover plate defining a first sealed space;
and a functional layer, located in the first sealed space, materials for the functional layer comprising a hydrolyzable and crosslinkable material;
the functional layer being adaptive to absorb moisture and be converted into a solidified layer, and the solidified layer having a degree of crosslinking greater than a degree of cross linking of the functional layer;
the cell string having a first surface and a second surface opposite each other, and a side surface connecting the first surface and the second surface, the first surface being away from the base plate, and the second surface facing the base plate;
and the first surface comprising a central region and a peripheral region surrounding the central region;
the photovoltaic module further comprising a separation layer in direct physical contact with the side surface, the peripheral region of the first surface, and the functional layer;
wherein the separation layer is configured to separate the functional layer from the cell string;
wherein a material for the separation layer is different from the material for the functional layer;
the photovoltaic module further comprising a second packaging layer filling a portion of the first sealed space not occupied by the cell string, the functional layer and the separation layer.

2. The photovoltaic module according to claim 1, wherein the separation layer is further in direct physical contact with the central region of the first surface, and the functional layer is further in direct physical contact with a portion of the separation layer corresponding to the central region of the first surface.

3. The photovoltaic module according to claim 1, wherein the functional layer is arranged around the cell string, and the functional layer, the base plate and the cover plate define a second sealed space.

4. The photovoltaic module according to claim 1, further comprising corner junction regions between the first packaging layer and the base plate, and between the first packaging layer and the cover plate, wherein the functional layer is located at least in the corner junction regions.

5. The photovoltaic module according to claim 4, wherein the functional layer is further located on an inner wall surface of the first packaging layer facing the cell string.

6. The photovoltaic module according to claim 1, wherein the base plate is a conductive substrate, and the cell string comprises a plurality of perovskite solar cells.

7. The photovoltaic module according to claim 1, wherein the base plate is a bearing board, and the cell string includes a plurality of perovskite solar cells.

8. The photovoltaic module according to claim 1, wherein the functional layer comprises a first functional layer and a second functional layer stacked in order,
the first functional layer is located between the second functional layer and the cell string,
a material for the first functional layer is a material that is already hydrolyzed and crosslinked based on a hydrolyzable and crosslinkable material,
and materials for the second functional layer comprises a hydrolyzable and crosslinkable material.

9. The photovoltaic module according to claim 1, wherein the separation layer is an ethylene vinyl acetate (EVA) film layer.

10. The photovoltaic module according to claim 1, wherein a material for the second packaging layer is different from the material for the functional layer.

11. The photovoltaic module according to claim 10, wherein the second packaging layer is an ethylene vinyl acetate (EVA) film layer.

12. The photovoltaic module according to claim 1, wherein a material for the first packaging layer includes a moisture-solidified material, a light-solidified material or an additive-curing material.

* * * * *